United States Patent
Konno et al.

(10) Patent No.: US 11,195,588 B2
(45) Date of Patent: Dec. 7, 2021

(54) SEMICONDUCTOR MEMORY DEVICE

(71) Applicant: Kioxia Corporation, Tokyo (JP)

(72) Inventors: Hayato Konno, Kanagawa (JP); Akihiro Imamoto, Kanagawa (JP)

(73) Assignee: KIOXIA CORPORATION, Tokyo (JP)

(*) Notice: Subject to any disclaimer, the term of this patent is extended or adjusted under 35 U.S.C. 154(b) by 0 days.

(21) Appl. No.: 17/012,969

(22) Filed: Sep. 4, 2020

(65) Prior Publication Data
US 2021/0193232 A1 Jun. 24, 2021

(30) Foreign Application Priority Data
Dec. 19, 2019 (JP) .............................. JP2019-229434

(51) Int. Cl.
*G11C 11/34* (2006.01)
*G11C 16/26* (2006.01)
*G11C 16/30* (2006.01)
*G11C 16/32* (2006.01)
*G11C 16/34* (2006.01)
*G11C 16/10* (2006.01)

(52) U.S. Cl.
CPC .............. *G11C 16/26* (2013.01); *G11C 16/10* (2013.01); *G11C 16/30* (2013.01); *G11C 16/32* (2013.01); *G11C 16/3445* (2013.01)

(58) Field of Classification Search
CPC .......... G11C 16/10; G11C 16/30; G11C 16/12; G11C 16/0483
USPC ........................................ 365/185.18, 185.22
See application file for complete search history.

(56) References Cited

U.S. PATENT DOCUMENTS

| | | | |
|---|---|---|---|
| 8,929,144 B2 * | 1/2015 | Izumi ................. | G11C 16/0408 365/185.17 |
| 10,120,584 B2 | 11/2018 | Shirakawa et al. | |
| 10,127,985 B2 * | 11/2018 | Yamaoka ............... | G11C 16/32 |
| 10,276,250 B1 * | 4/2019 | Chen .................... | G11C 16/105 |
| 2017/0262229 A1 | 9/2017 | Ochi et al. | |
| 2019/0057742 A1 | 2/2019 | Jeon et al. | |
| 2019/0243577 A1 | 8/2019 | Pelster et al. | |

FOREIGN PATENT DOCUMENTS

JP 2015176309 A 10/2015

* cited by examiner

*Primary Examiner* — Son T Dinh
(74) *Attorney, Agent, or Firm* — Holtz, Holtz & Volek PC

(57) ABSTRACT

A semiconductor memory device includes a first memory cell, a second memory cell, and a first wiring and a second wiring electrically connected to the first memory cell and the second memory cell. In a write operation, a program operation starts at a first timing and a supply of a write pass voltage starts at a second timing. When a first command is received in a first period between the first timing and the second timing, the write operation is interrupted before the supply of the write pass voltage starts.

13 Claims, 28 Drawing Sheets

SEMICONDUCTOR MEMORY DEVICE

CROSS-REFERENCE TO RELATED APPLICATIONS

This application is based upon and claims the benefit of Japanese Patent Application No. 2019-229434, filed on Dec. 19, 2019, the entire contents of which are incorporated herein by reference.

BACKGROUND

Field

Embodiments described herein relate generally to a semiconductor memory device.

Description of the Related Art

There has been known a semiconductor memory device that includes a memory string including a plurality of memory cells, a plurality of wirings electrically connected to the plurality of memory cells, and a voltage supply circuit configured to supply voltages to the plurality of wirings.

DETAILED DESCRIPTION

Figure 1:
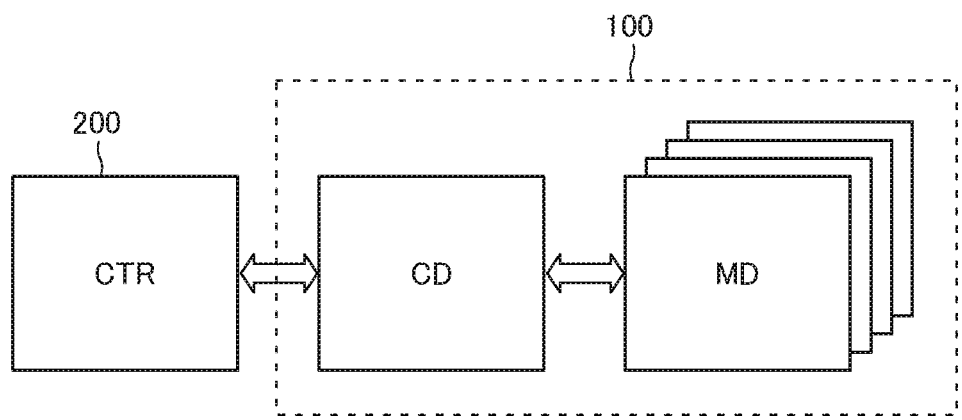
FIG. 1 is a schematic block diagram illustrating a configuration of a memory system 100 according to a first embodiment.

A semiconductor memory device according to one embodiment includes: a first memory string that includes a first memory cell and a second memory cell; a first wiring electrically connected to the first memory cell; a second wiring electrically connected to the second memory cell; a voltage supply circuit configured to supply a write pass voltage and a program voltage to the first wiring and the second wiring, the program voltage being larger than the write pass voltage; and a control circuit configured to control the voltage supply circuit. The control circuit is configured: to perform a program operation in a write operation to the first memory cell; to supply the program voltage to the first wiring and supply the write pass voltage to the second wiring in the program operation; to start the program operation at a first timing of the write operation; to start supplying the write pass voltage to the second wiring at a second timing after the first timing, the write pass voltage corresponding to the program operation; and such that when a first command is received in a first period between the first timing and the second timing, the control circuit suspends the write operation before the supply of the write pass voltage corresponding to the program operation starts.

A semiconductor memory device according to one embodiment includes: a memory string that includes a first memory cell and a second memory cell; a first wiring electrically connected to the first memory cell; a second wiring electrically connected to the second memory cell; a voltage supply circuit configured to supply a verify voltage and a read pass voltage to the first wiring and the second wiring, the read pass voltage being larger than the verify voltage; and a control circuit configured to control the voltage supply circuit. The control circuit is configured: to perform a program verify operation in a write operation to the first memory cell; to supply the verify voltage to the first wiring and supply the read pass voltage to the second wiring in the program verify operation; to start supplying the read pass voltage to the second wiring at a first timing of the write operation, the read pass voltage corresponding to the program verify operation; to start supplying a first verify voltage to the first wiring at a second timing after the first timing, the first verify voltage corresponding to the program verify operation; to cause a voltage of the first wiring to be the first verify voltage at a third timing after the second timing; to start supplying a second verify voltage to the first wiring at a fourth timing after the third timing; such that when a first command is received in a first period between the first timing and the third timing, the control circuit suspends the write operation at the third timing; and such that when the first command is received in a second period between the third timing and the fourth timing, the control circuit suspends the write operation before the supply of the second verify voltage starts.

A semiconductor memory device according to one embodiment includes: a first memory string that includes a first memory cell and a second memory cell; a first wiring electrically connected to the first memory cell; a second wiring electrically connected to the second memory cell; a voltage supply circuit configured to supply a write pass voltage and a program voltage to the first wiring and the second wiring, the program voltage being larger than the write pass voltage; a control circuit configured to control the voltage supply circuit; a first terminal usable to input a command to the control circuit; and a second terminal usable to output information indicative of a state of the control circuit. The control circuit is configured: to perform a program operation in a write operation to the first memory cell; to supply the program voltage to the first wiring and supply the write pass voltage to the second wiring in the program operation; to start the write operation in response to reception of a first command via the first terminal; to change the information to be output from the second terminal from a first state to a second state at a first timing of the write operation; to start the program operation at a second timing after the first timing; to start supplying the write pass voltage to the second wiring at a third timing after the second timing, the write pass voltage corresponding to the program operation; and such that when a second command is received via the first terminal in a first period between the second timing and the third timing, the control circuit changes the information to be output from the second terminal from the second state to the first state without supplying the write pass voltage corresponding to the program operation.

A semiconductor memory device according to one embodiment includes: a first memory string that includes a first memory cell and a second memory cell; a first wiring electrically connected to the first memory cell; a second wiring electrically connected to the second memory cell; a voltage supply circuit configured to supply a read pass voltage, a write pass voltage, and a program voltage to the first wiring and the second wiring, the program voltage being larger than the read pass voltage and the write pass voltage; a control circuit configured to control the voltage supply circuit; a first terminal usable to input a command to the control circuit; and a second terminal usable to output information indicative of a state of the control circuit. The control circuit is configured: to perform a program operation and a program verify operation performed in a write operation to the first memory cell, and the program verify operation is performed after the program operation is performed; to supply the program voltage to the first wiring and supply the write pass voltage to the second wiring in the program operation; to supply the read pass voltage to the second wiring in the program verify operation; to start the write operation in response to reception of a first command via the first terminal; to change the information to be output from the second terminal from a first state to a second state at a first timing of the write operation; to start the program operation at a second timing after the first timing; to start supplying the write pass voltage to the second wiring at a third timing after the second timing, the write pass voltage corresponding to the program operation; to terminate the supply of the write pass voltage to the second wiring at a fourth timing after the third timing, the write pass voltage corresponding to the program operation; to start supplying a read pass voltage to the second wiring at a fifth timing after the fourth timing, the read pass voltage corresponding to the program verify operation; such that when a second command is received via the first terminal in a first period between the second timing and the third timing, the control circuit changes the information to be output from the second terminal from the second state to the first state at a sixth timing after the second timing; and such that when the second command is received via the first terminal in a second period between the third timing the fifth timing, the control circuit changes the information to be output from the second terminal from the second state to the first state at a seventh timing after the third timing. A period from the first timing until the sixth timing is shorter than a period from the first timing until the seventh timing.

Next, semiconductor memory devices according to embodiments are described in detail with reference to the accompanying drawings. The following embodiments are only examples, and not described for the purpose of limiting the present invention.

A "control circuit" in this specification means a circuit, such as a sequencer, disposed in a memory die in some cases.

In this specification, when referring to that a first configuration "is electrically connected" to a second configuration, the first configuration may be directly connected to the second configuration, or the first configuration may be connected to the second configuration via a wiring, a semiconductor member, a transistor, or the like. For example, when three transistors are connected in series, even when the 2nd transistor is in OFF state, the 1st transistor is "electrically connected" to the 3rd transistor.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like turns ON.

First Embodiment

[Configuration]

FIG. 1 is a schematic block diagram illustrating a configuration of a memory system 100 according to the first embodiment.

For example, the memory system 100 reads, writes, and erases user data in response to a signal transmitted from a host computer 200. The memory system 100 is, for example, any system that can store the user data including a memory chip, a memory card, and an SSD. The memory system 100 includes a plurality of memory dies MD that store the user data and a control die CD connected to the plurality of memory dies MD and the host computer 200. The control die CD includes, for example, a processor, a RAM, and the like, and performs processes, such as conversion between a logical address and a physical address, bit error detection/correction, and wear leveling.

Figure 2:
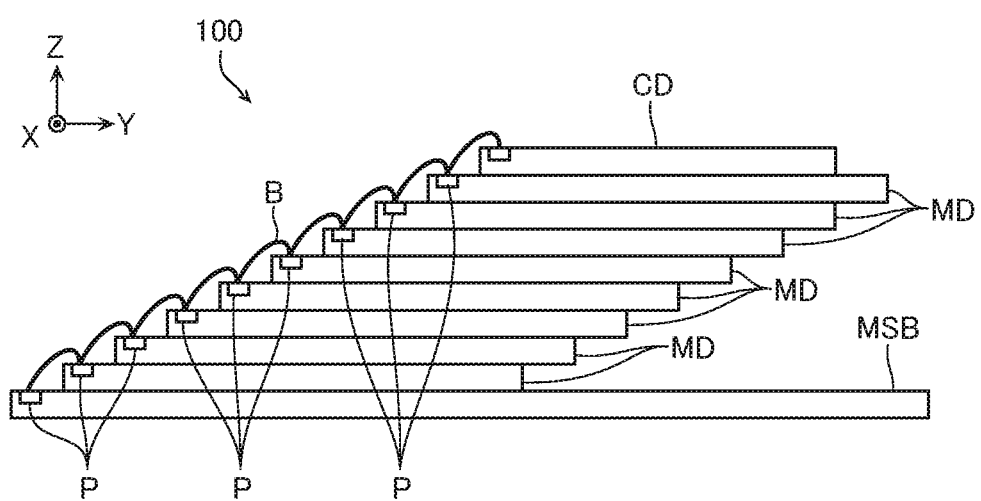
FIG. 2 is a schematic side view illustrating an exemplary configuration of the memory system 100.
Figure 3:
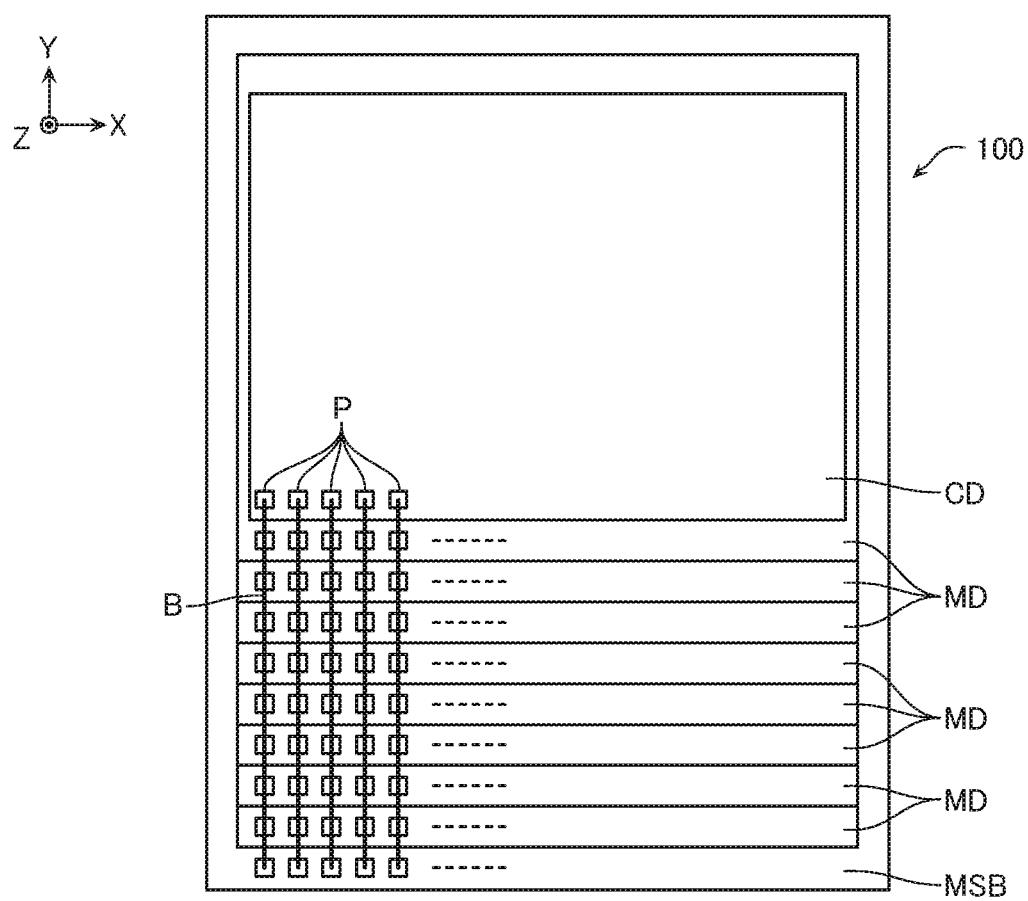
FIG. 3 is a schematic plan view illustrating the exemplary configuration.

FIG. 2 is a schematic side view illustrating an exemplary configuration of the memory system 100 according to the embodiment. FIG. 3 is a schematic plan view illustrating the exemplary configuration. For convenience of description, FIG. 2 and FIG. 3 omit a part of a configuration.

As illustrated in FIG. 2, the memory system 100 according to the embodiment includes a mounting substrate MSB, the plurality of memory dies MD laminated on the mounting substrate MSB, and the control die CD laminated on the memory die MD. On an upper surface of the mounting substrate MSB, pad electrodes P are disposed in a region at an end portion in a Y-direction, and a part of the other region is connected to a lower surface of the memory die MD via an adhesive and the like. On an upper surface of the memory die MD, pad electrodes P are disposed in a region at an end portion in the Y-direction, and the other region is connected to a lower surface of another memory die MD or the control die CD via the adhesive and the like. On an upper surface of the control die CD, pad electrodes P are disposed in a region at an end portion in the Y-direction.

As illustrated in FIG. 3, the mounting substrate MSB, the plurality of memory dies MD, and the control die CD each include a plurality of the pad electrodes P arranged in an X-direction. The plurality of pad electrodes P disposed on each of the mounting substrate MSB, the plurality of memory dies MD, and the control die CD are mutually connected via bonding wires B.

Figure 4:
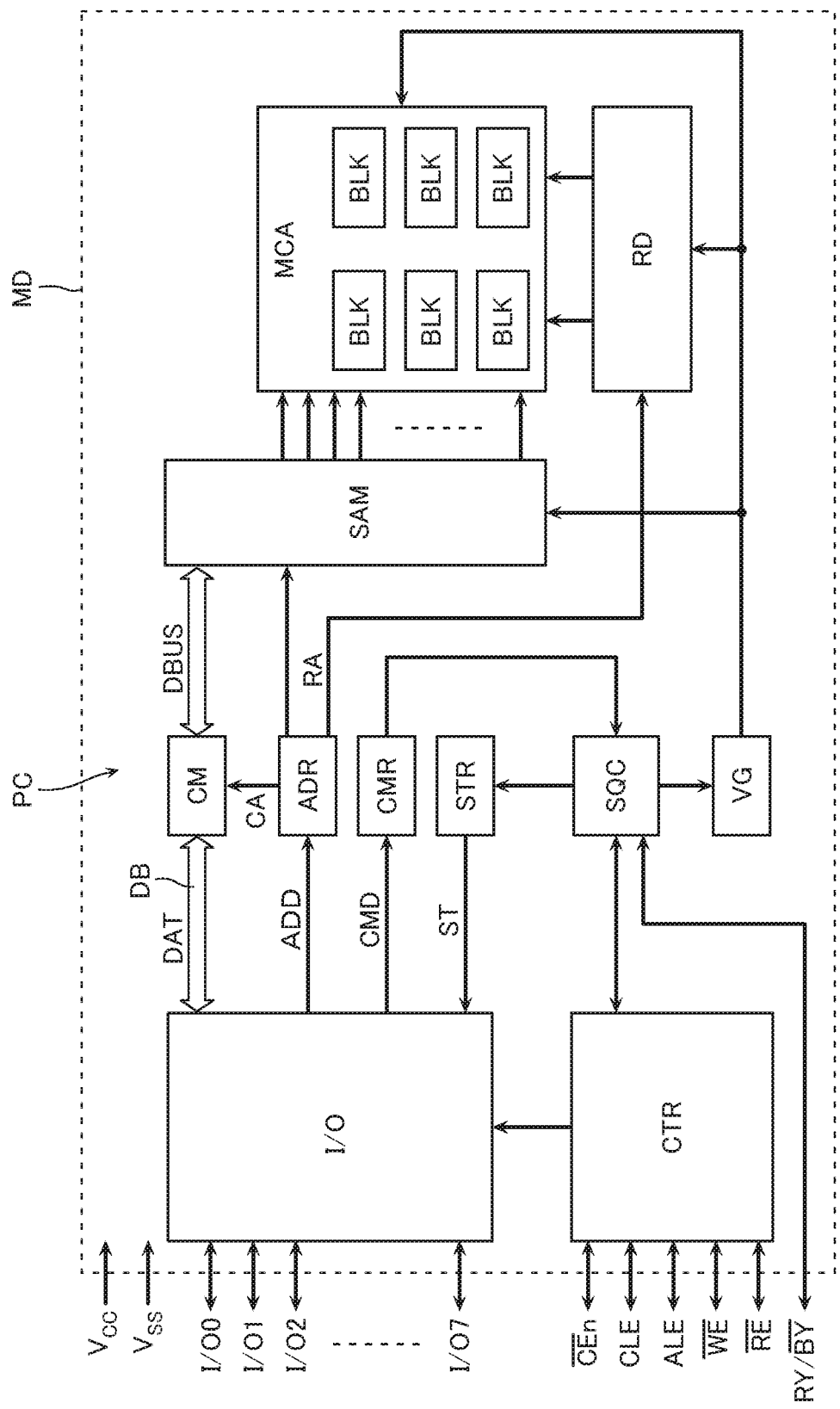
FIG. 4 is a schematic block diagram illustrating a configuration of a memory die MD according to the first embodiment.
Figure 5:
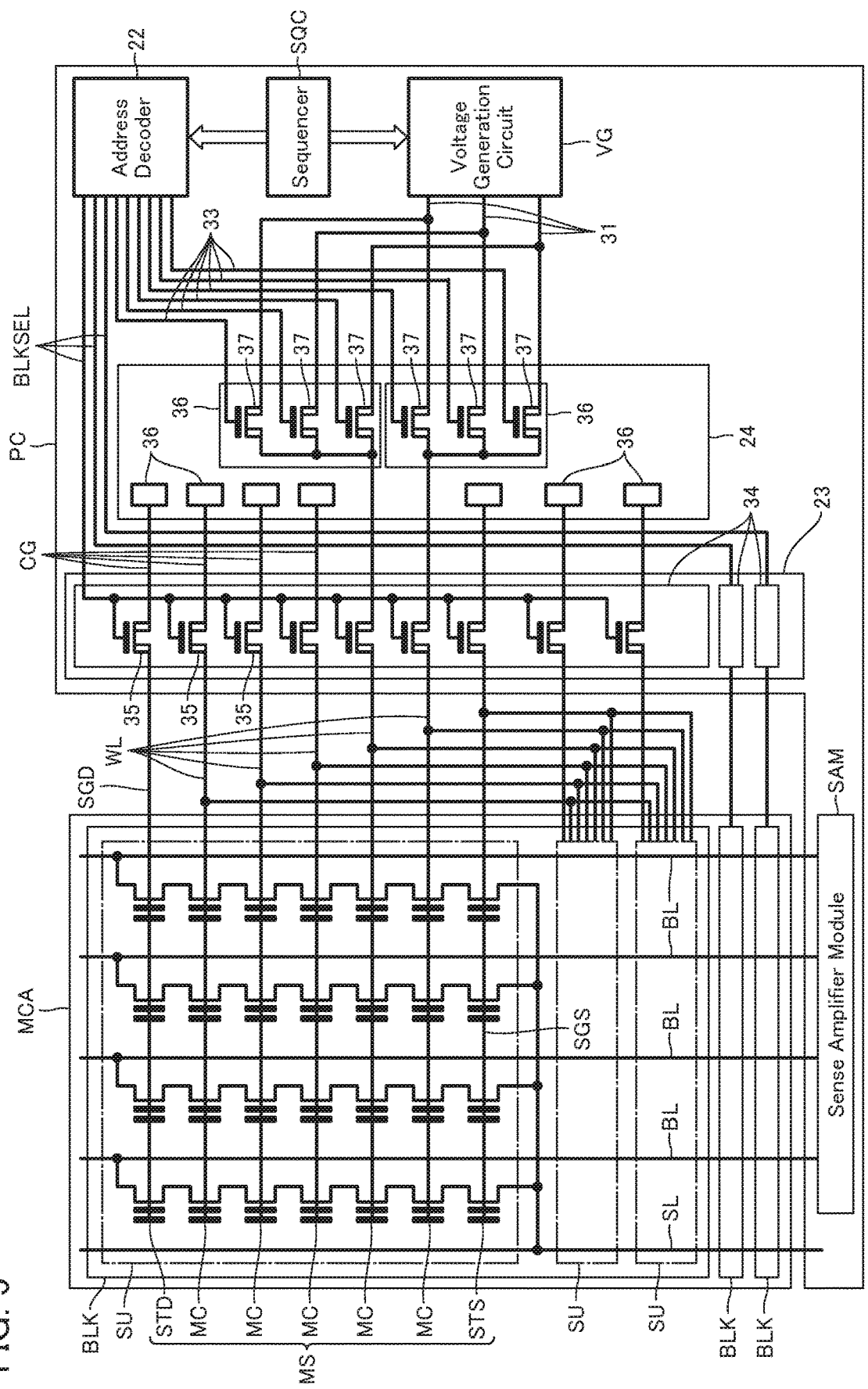
FIG. 5 is a schematic circuit diagram illustrating a configuration of a part of the memory die MD.
Figure 6:
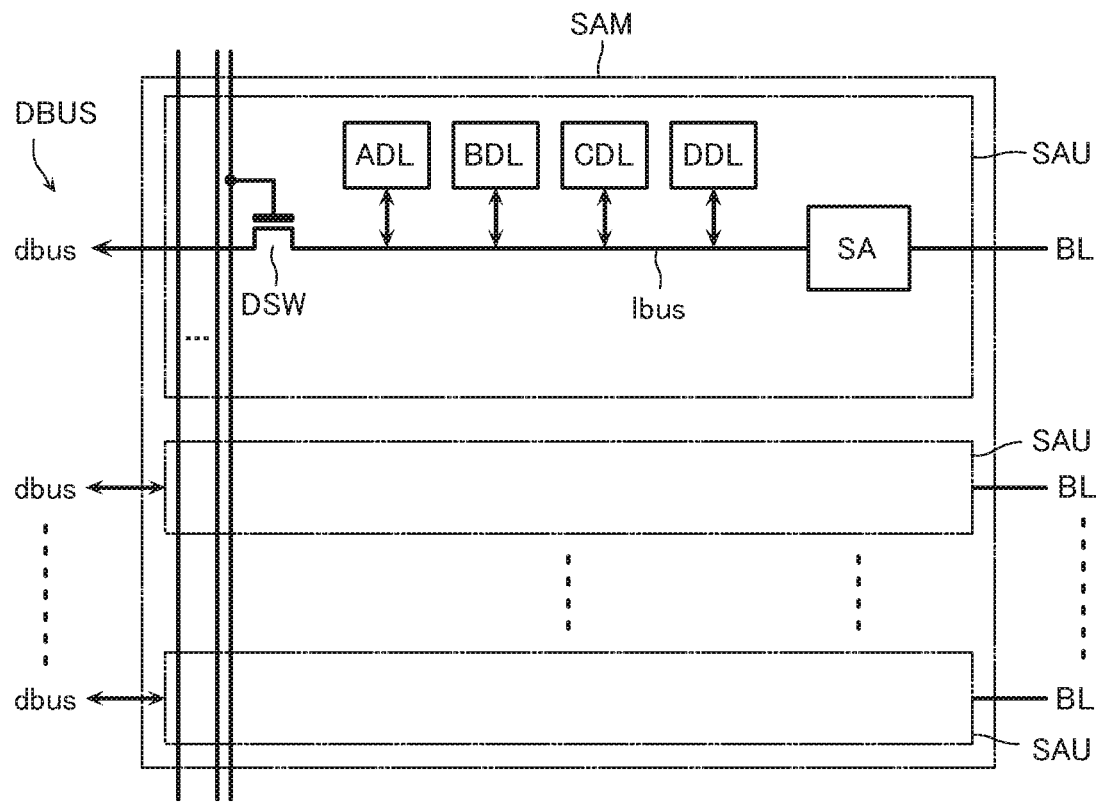
FIG. 6 is a schematic block diagram illustrating a configuration of a part of the memory die MD.

FIG. 4 is a schematic block diagram illustrating a configuration of the memory die MD according to the first embodiment. FIG. 5 is a schematic circuit diagram illustrating a configuration of a part of the memory die MD. FIG. 6 is a schematic block diagram illustrating a configuration of a part of the memory die MD.

As illustrated in FIG. 4, the memory die MD includes a memory cell array MCA that stores data and a peripheral circuit PC connected to the memory cell array MCA.

The memory cell array MCA includes a plurality of memory blocks BLK as illustrated in FIG. 5. The plurality of memory blocks BLK each include a plurality of string units SU. The plurality of string units SU each include a plurality of memory strings MS. The plurality of memory strings MS have one ends each connected to the peripheral circuit PC via a bit line BL. The plurality of memory strings MS have other ends each connected to the peripheral circuit PC via a common source line SL.

The memory string MS includes a drain select transistor STD, a plurality of memory cells MC (memory transistors), and a source select transistor STS, which are connected in series between the bit line BL and the source line SL. Hereinafter, the drain select transistor STD and the source select transistor STS may be simply referred to as select transistors (STD, STS).

The memory cell MC is a field-effect type transistor including a semiconductor layer that functions as a channel region, a gate insulating film including an electric charge accumulating film, and a gate electrode. The memory cell MC has a threshold voltage that changes according to an electric charge amount in the electric charge accumulating film. The memory cell MC stores one bit or a plurality of bits of data. Word lines WL are connected to respective gate electrodes of the plurality of memory cells MC corresponding to one memory string MS. These respective word lines WL are connected to all of the memory strings MS in one memory block BLK in common.

The select transistor (STD, STS) is a field-effect type transistor including a semiconductor layer that functions as a channel region, a gate insulating film, and a gate electrode. The select gate lines (SGD, SGS) are connected to respective gate electrodes of the select transistors (STD, STS). Drain select line SGD is disposed corresponding to the string unit SU and connected to all of the memory strings MS in one string unit SU in common. Source select line SGS is connected to all of the memory strings MS in one memory block BLK in common.

The peripheral circuit PC includes, as illustrated in FIG. 4, a voltage generation circuit VG, a row decoder RD, a sense amplifier module SAM, and a sequencer SQC. The peripheral circuit PC includes a cache memory CM, an address register ADR, a command register CMR, and a status register STR. The peripheral circuit PC includes an input/output control circuit I/O and a logic circuit CTR.

For example, as illustrated in FIG. 5, the voltage generation circuit VG includes a plurality of operating voltage output terminals 31. The voltage generation circuit VG includes, for example, a step down circuit, such as a regulator, and a step up circuit, such as a charge pump circuit. These step down circuit and charge pump circuit are each connected to a terminal (FIG. 4) to which a power supply voltage $V_{CC}$ and a ground voltage $V_{SS}$ are supplied. These terminals are achieved by, for example, the pad electrodes P described with reference to FIG. 2 and FIG. 3. For example, the voltage generation circuit VG generates a plurality of patterns of operating voltages applied to the bit line BL, the source line SL, the word line WL, and the select gate lines (SGD, SGS) in a read operation, a write operation, and an erase operation on the memory cell array MCA, in accordance with a control signal from the sequencer SQC to simultaneously output the operating voltages to the plurality of operating voltage output terminals 31. The operating voltage output from the operating voltage output terminal 31 is appropriately adjusted in accordance with the control signal from the sequencer SQC.

In the read operation, the voltage generation circuit VG generates a read voltage and a read pass voltage as the operating voltages. The read voltage is a voltage used to distinguish data stored in the selected memory cell MC. When the read voltage is applied to the word line WL, a part of the plurality of memory cells MC connected to the word line WL enters an ON state and the memory cells MC other than that enter an OFF state. The read voltage may be a voltage, for example, in a range larger than 0 V and smaller than 7 V. The read pass voltage is a voltage to set the memory cell MC to the ON state. Therefore, the read pass voltage is larger than the read voltage and a verify voltage described later. When the read pass voltage is applied to the word lines WL, all of the plurality of memory cells MC connected to the word lines WL enter the ON state. The read pass voltage may be a voltage, for example, in a range larger than 5 V and smaller than 10 V.

Additionally, in the write operation, the voltage generation circuit VG generates a write pass voltage and a program voltage as the operating voltages. The write pass voltage is a voltage to set the memory cell MC to the ON state and larger than the read voltage. When the write pass voltage is applied to the word lines WL, all of the plurality of memory cells MC connected to the word lines WL enter the ON state. The write pass voltage may be a voltage, for example, in a range larger than 7 V and smaller than 15 V. The program voltage is a voltage to accumulate an electric charge in the electric charge accumulating film of the memory cell MC and larger than the write pass voltage. When the program voltage is applied to the word lines WL, electrons are accumulated in a part of the electric charge accumulating films among the electric charge accumulating films in the plurality of memory cells MC, and this increases a threshold voltage of the memory cells MC. The program voltage may be a voltage, for example, in a range larger than 15 V and smaller than 30 V.

In the write operation, the voltage generation circuit VG generates the verify voltage and the read pass voltage as the operating voltages. The verify voltage is a voltage used to distinguish whether the threshold voltage in the selected memory cell MC sufficiently has increased or not. When the verify voltage is applied to the word lines WL, among the plurality of memory cells MC connected to the word lines WL, the memory cell MC where the threshold voltage does not sufficiently increase enters the ON state and the memory cell MC where the threshold voltage sufficiently increases enters the OFF state. The verify voltage may be a voltage, for example, in a range larger than 0 V and smaller than 7 V.

The row decoder RD (FIG. 4) includes, for example, as illustrated in FIG. 5, an address decoder 22 that decodes address data ADD and a block select circuit 23 and a voltage select circuit 24 that transfer the operating voltage to the memory cell array MCA in response to the output signal from the address decoder 22.

The address decoder 22 includes a plurality of block select lines BLKSEL and a plurality of voltage select lines 33. For example, the address decoder 22 sequentially refers to a row address RA in the address register ADR (FIG. 4) in accordance with the control signal from the sequencer SQC, decodes this row address RA to cause a predetermined block select transistor 35 and voltage select transistor 37 corresponding to the row address RA to be in a state of ON, and cause the block select transistors 35 and the voltage select transistors 37 other than the above to be in a state of OFF. For example, voltages of the predetermined block select line BLKSEL and voltage select line 33 are set to be in a state of "H" and voltages other than those are set to be in a state of "L." When a P channel type transistor is used, not an N channel type transistor, an inverse voltage is applied to these wirings.

In the illustrated example, in the address decoder 22, one block select line BLKSEL is disposed per memory block BLK. However, this configuration is appropriately changeable. For example, one block select line BLKSEL may be included in per two or more memory blocks BLK.

The block select circuit 23 includes a plurality of block selectors 34 corresponding to the memory blocks BLK. The plurality of block selectors 34 each include a plurality of block select transistors 35 corresponding to the word lines WL and the select gate lines (SGD, SGS). The block select transistor 35 is, for example, a field-effect type high voltage transistor. The block select transistors 35 have drain electrodes, source electrodes and gate electrodes. The drain electrodes are each electrically connected to the corresponding word line WL or select gate line (SGD, SGS). The source electrodes are each electrically connected to the operating voltage output terminal 31 via a wiring CG and the voltage select circuit 24. The gate electrodes are commonly connected to the corresponding block select line BLKSEL.

In the illustrated example, in the block select circuit 23, one block select transistor 35 is disposed per word line WL and one block select transistor 35 is disposed per one select gate line (SGD, SGS). However, this configuration is appropriately changeable. For example, the two block select transistors 35 may be disposed per select gate line (SGD, SGS).

The voltage select circuit 24 includes a plurality of voltage selectors 36 corresponding to the word lines WL and the select gate lines (SGD, SGS). The plurality of voltage selectors 36 each include a plurality of voltage select transistors 37. The voltage select transistor 37 is, for example, a field-effect type high voltage transistor. The voltage select transistors 37 have drain electrodes, source electrodes and gate electrodes. The drain electrodes are each electrically connected to the corresponding word line WL or the select gate line (SGD, SGS) via the wiring CG and the block select circuit 23. The source electrodes are each electrically connected to the corresponding operating voltage output terminal 31. The gate electrodes are each connected to the corresponding voltage select line 33.

The sense amplifier module SAM is connected to the plurality of bit lines BL. The sense amplifier module SAM includes, for example, as illustrated in FIG. 6, a plurality of sense amplifier units SAU corresponding to the bit lines BL. The sense amplifier units SAU each include a sense amplifier circuit SA connected to the bit line BL, a wiring lbus connected to the sense amplifier circuit SA, a plurality of latch circuits ADL, BDL, CDL, DDL connected to the sense amplifier circuit SA via this wiring lbus, and a switch transistor DSW connected between the wiring lbus and a wiring dbus.

The sense amplifier circuit SA includes, for example, a sense circuit that senses a current in the bit line BL, a latch circuit that latches data sensed by this sense circuit, and a voltage transfer circuit that transfers different voltages to the bit lines BL according to the data latched by this latch circuit. The sense circuit includes, for example, a sense transistor. The sense transistor includes a gate electrode connected to the bit line BL, a drain electrode connected to the wiring lbus, and a source electrode connected to a grounding terminal. The latch circuit is connected to, for example, the wiring lbus. The voltage transfer circuit includes, for example, a first transistor that connects the bit line BL to a first voltage supply line and a second transistor that connects the bit line BL to a second voltage supply line. Gate electrodes of these first transistor and second transistor are connected to the latch circuit.

The latch circuits ADL, BDL, CDL, DDL latch the user data written to the memory cell MC in the write operation. The latch circuits ADL, BDL, CDL, DDL are used for, for example, various kinds of arithmetic processing.

Note that the plurality of sense amplifier units SAU are each connected to the cache memory CM (FIG. 4) via a data bus DBUS including the plurality of wirings dbus. The cache memory CM include a plurality of latch circuits corresponding to the sense amplifier units SAU. The user data written to the memory cell MC in the write operation or the user data read from the memory cell MC in the read operation is latched to the cache memory CM.

Additionally, a decode circuit and a switch circuit (not illustrated) are connected to the cache memory CM. The decode circuit decodes a column address CA held in the address register ADR. The switch circuit electrically conducts the latch circuit corresponding to the column address CA with the bus DB in response to an output signal from the decode circuit.

The sequencer SQC sequentially decodes command data CMD latched in the command register CMR and outputs an internal control signal to the row decoder RD, the sense amplifier module SAM, and the voltage generation circuit VG. The sequencer SQC outputs status data indicating its own state to the status register STR as necessary. The sequencer SQC generates a ready/busy signal and outputs the ready/busy signal to a terminal RY//BY. The terminal RY//BY is achieved by, for example, the pad electrode P described with reference to FIG. 2 and FIG. 3.

The input/output control circuit I/O includes data input/output terminals I/O0 to I/O7, an input circuit, such as a comparator, and an output circuit, such as an OCD circuit. The input circuit and the output circuit are connected to the data input/output terminals I/O0 to I/O7. The input/output control circuit I/O includes a shift register connected to the input circuit and the output circuit, and a buffer circuit. The data input/output terminals I/O0 to I/O7 are achieved by, for example, the pad electrodes P described with reference to FIG. 2 and FIG. 3. Data input via the data input/output terminals I/O0 to I/O7 is output from the buffer circuit to the cache memory CM, the address register ADR, or the command register CMR in response to an internal control signal from the logic circuit CTR. Data output via the data input/output terminals I/O0 to I/O7 is input to the buffer circuit from the cache memory CM or the status register STR in response to the internal control signal from the logic circuit CTR.

The logic circuit CTR receives an external control signal from the control die CD via external control terminals /CEn, CLE, ALE, /WE, /RE and outputs the internal control signal to the input/output control circuit I/O in response to the external control signal. The external control terminals /CEn, CLE, ALE, /WE, /RE are achieved by, for example, the pad electrodes P described with reference to FIG. 2 and FIG. 3.

The external control terminal /CEn is used for selecting the memory die MD. The input/output control circuit I/O of the memory die MD with the external control terminal /CEn to which "L" is input performs an input/output of the data via the data input/output terminals I/O0 to I/O7. The input/output control circuit I/O of the memory die MD with the external control terminal /CEn to which "H" is input does not perform the input/output of the data via the data input/output terminals I/O0 to I/O7.

The external control terminal CLE is used for the use of the command register CMR. When "H" is input to the external control terminal CLE, the data input via the data input/output terminals I/O0 to I/O7 is stored as the command data CMD in a buffer memory in the input/output control circuit I/O, and transferred to the command register CMR.

The external control terminal ALE is used for the use of the address register ADR. When "H" is input to the external control terminal ALE, the data input via the data input/output terminals I/O0 to I/O7 is stored as the address data ADD in the buffer memory in the input/output control circuit I/O, and transferred to the address register ADR.

When "L" is input to both the external control terminals CLE, ALE, the data input via the data input/output terminals I/O0 to I/O7 is stored as user data DAT in the buffer memory in the input/output control circuit I/O, and transferred to the cache memory CM via the bus DB.

The external control terminal /WE is used for the input of the data via the data input/output terminals I/O0 to I/O7. The data input via the data input/output terminals I/O0 to I/O7 is retrieved in the shift register in the input/output control circuit I/O at a timing of a voltage rise (switching of an input signal) of the external control terminal /WE.

The external control terminal /RE is used for the output of the data via the data input/output terminals I/O0 to I/O7. The data output from the data input/output terminals I/O0 to I/O7 is switched at a timing of a voltage rise (switching of an input signal) of the external control terminal /RE.

[Read Operation]

Next, the read operation of the semiconductor memory device according to the embodiment will be described. Note that, in the following description, the operation of transferring the user data stored in the memory cell array MCA to the cache memory CM is referred to as a first read operation. Additionally, the operation of outputting the user data held in the cache memory CM to the control die CD via the data input/output terminals I/O0 to I/O7 is referred to as a second read operation.

Figure 7:
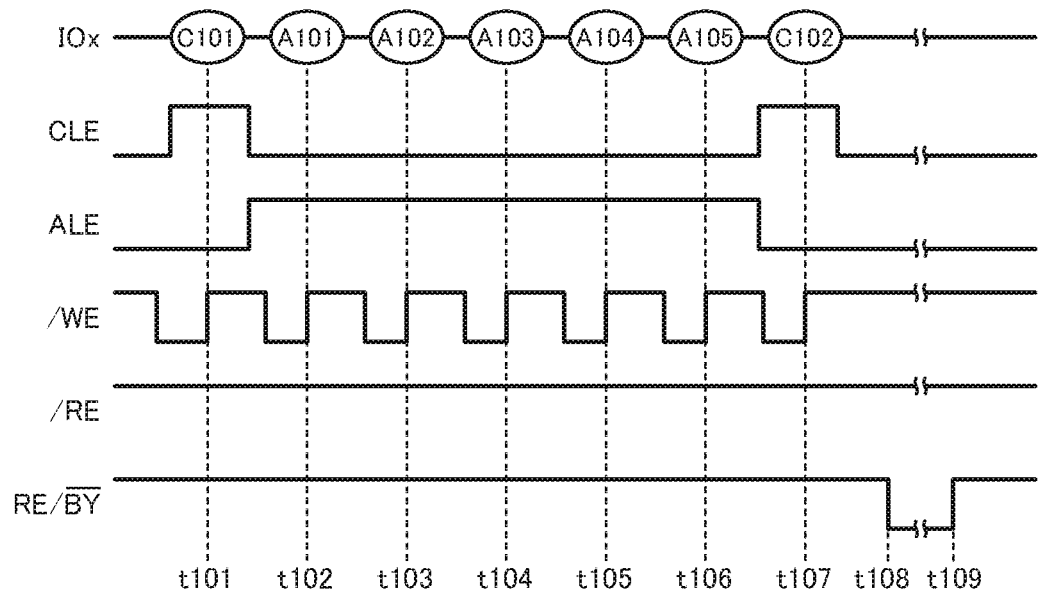
FIG. 7 is a timing chart to describe a first read operation according to the first embodiment.

FIG. 7 is a timing chart to describe the first read operation.

FIG. 7 exemplifies a command set input to the memory die MD in the first read operation. This command set includes data C101, A101, A102, A103, A104, A105 and data C102.

At a timing t101, the control die CD inputs the data C101 to the memory die MD as the command data CMD. That is, the voltages of the data input/output terminals I/O0 to I/O7 are set to "H" or "L" according to the respective bits of the data C101, and in a state where "H" is input to the external control terminal CLE and "L" is input to the external control terminal ALE, the external control terminal /WE is risen from "L" to "H." The data C101 is a command input at the start of the first read operation.

At a timing t102, the control die CD inputs the data A101 to the memory die MD as the address data ADD. That is, the voltages of the data input/output terminals I/O0 to I/O7 are set to "H" or "L" according to the respective bits of the data A101, and in a state where "L" is input to the external control terminal CLE and "H" is input to the external control terminal ALE, the external control terminal /WE is risen from "L" to "H." The data A101 is a part of the column address CA.

At a timing t103, the control die CD inputs the data A102 to the memory die MD as the address data ADD. The data A102 is a part of the column address CA.

At a timing t104, the control die CD inputs the data A103 to the memory die MD as the address data ADD. The data A103 is a part of the row address RA. The data A103 includes, for example, a block address to identify the memory block BLK (FIG. 5) and a page address to identify the string unit SU and the word line WL.

At a timing t105, the control die CD inputs the data A104 to the memory die MD as the address data ADD. The data A104 is a part of the row address RA. The data A104 includes, for example, the block address and the page address.

At a timing t106, the control die CD inputs the data A105 to the memory die MD as the address data ADD. The data A105 includes a chip address to identify one memory die MD from the plurality of memory dies MD controlled by the control die CD.

At a timing t107, the control die CD inputs the data C102 to the memory die MD as the command data CMD. The data C102 is a command indicative of the termination of the input of the command set regarding the first read operation.

At a timing t108, the terminal RY//BY enters the "L" state from the "H" state and an access to the memory die MD is inhibited. The first read operation is performed in the memory die MD.

At a timing t109, the first read operation in the memory die MD terminates. Additionally, the terminal RY//BY enters the "H" state from the "L" state and the access to the memory die MD is permitted.

Figure 8:
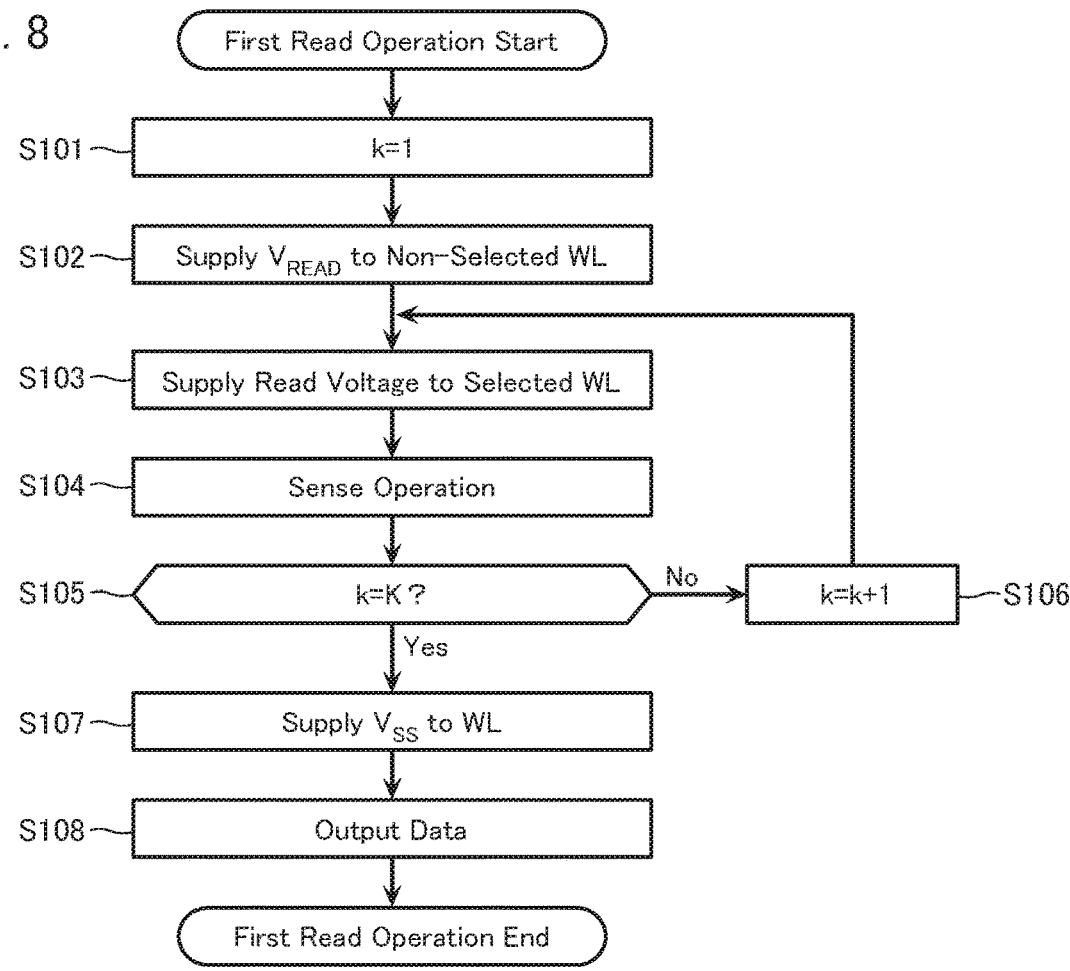
FIG. 8 is a flowchart to describe the first read operation according to the first embodiment.
Figure 9:
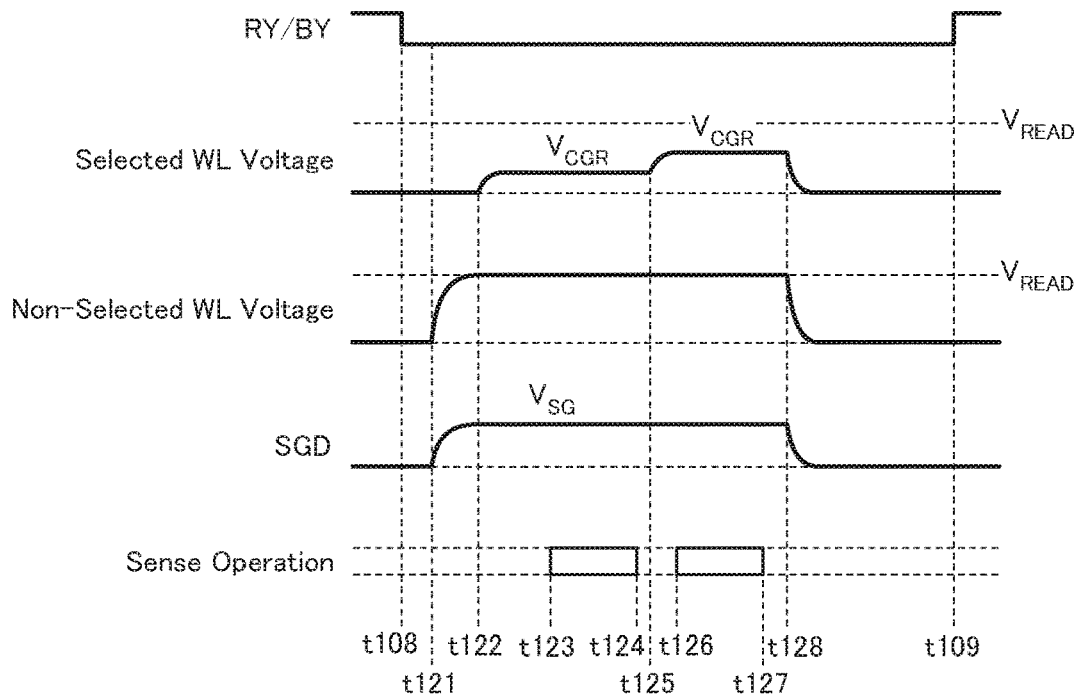
FIG. 9 is a timing chart to describe the first read operation according to the first embodiment.

FIG. 8 is a flowchart to describe the first read operation. FIG. 9 is a timing chart to describe the first read operation. Note that, in the following description, an example in which each memory cell MC stores a plurality of pieces of bit data and a plurality of patterns of read voltages are used in the first read operation will be described.

At Step S101, a variable k is set to 1. This operation is performed at the timing t108 in FIG. 9.

At Step S102, the read pass voltage $V_{READ}$ is supplied to non-selected word lines WL. For example, the read pass voltage $V_{READ}$ is output from the predetermined operating voltage output terminal 31 of the voltage generation circuit VG (FIG. 5). The word lines WL corresponding to the data A101 to A105 are identified as the selected word lines WL and the word lines WL other than these are identified as the non-selected word lines WL. The plurality of non-selected word lines WL are electrically conducted with the predetermined operating voltage output terminals 31 via the block select transistors 35, the wirings CG, and the voltage select transistors 37. At Step S102, a voltage $V_{SG}$ is supplied to the drain select lines SGD and the source select lines SGS corresponding to the data A101 to A105. The voltage $V_{SG}$ has a magnitude to an extent that the select transistors (STD, STS) enter the ON state. This operation is performed, for example, at a timing t121 in FIG. 9.

At Step S103, a read voltage $V_{CGR}$ is supplied to the selected word lines WL. This operation is performed, for example, at timings t122 and t125 in FIG. 9.

At Step S104, a sense operation is performed. For example, in a state of supplying a predetermined bit line voltage to the bit line BL (FIG. 5), a sense node of the sense amplifier circuit SA (FIG. 6) is electrically conducted with the bit line BL for a certain period. The sense operation is performed, for example, at timings t123 to t124 and timings t126 to t127 in FIG. 9. Note that after performing the sense operation, the sense transistor electrically conducts with the wiring lbus (FIG. 6) and the electric charge of the wiring lbus is discharged or maintained. Any of the latch circuits in the sense amplifier unit SAU electrically conducts with the wiring lbus, and the data of the wiring lbus is latched by this latch circuit.

At Step S105, whether the variable k has reached K (K is a natural number) or not is determined. When the variable k is not reached, the process proceeds to Step S106. When the variable k is reached, the process proceeds to Step S107. Note that FIG. 9 illustrates an example of K being 2.

At Step S106, 1 is added to the variable k. Moreover, the read voltage $V_{CGR}$ is increased or reduced in the voltage generation circuit VG (FIG. 5). Afterwards, the process proceeds to Step S103.

At Step S107, the ground voltage $V_{SS}$ is supplied to the selected word line WL, the non-selected word line WL, and the select gate line (SGD, SGS). This operation is performed, for example, at a timing t128 in FIG. 9.

At Step S108, the data latched by the latch circuit in the sense amplifier circuit SA is transferred to the cache memory CM (FIG. 4) via the wiring lbus (FIG. 6), the switch transistor DSW, and the wiring dbus. This operation is performed, for example, between the timing t128 and the timing t109 in FIG. 9. Afterwards, the first read operation is terminated.

Figure 10:
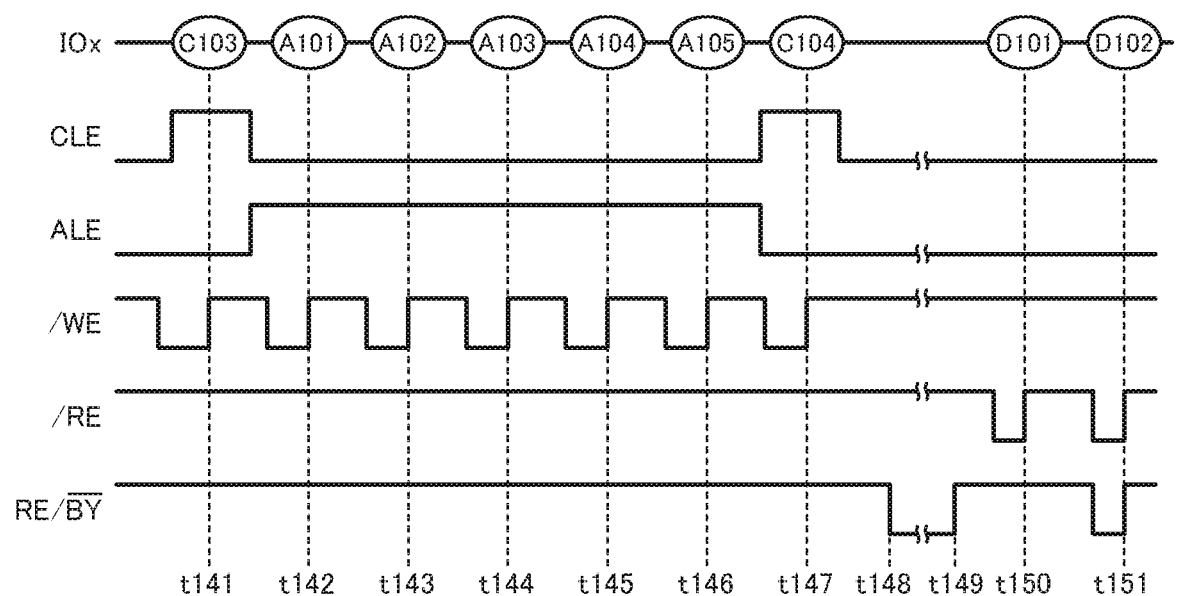
FIG. 10 is a timing chart to describe a second read operation according to the first embodiment.

FIG. 10 is a timing chart to describe a second read operation.

FIG. 10 exemplifies a command set input to the memory die MD in the second read operation. This command set includes data C103, A101, A102, A103, A104, A105 and data C104.

At the timing t141, the control die CD inputs the data C103 to the memory die MD as the command data CMD. The data C103 is a command input at the start of the second read operation.

At a timing t142, the control die CD inputs the data A101 to the memory die MD as the address data ADD.

At a timing t143, the control die CD inputs the data A102 to the memory die MD as the address data ADD.

At a timing t144, the control die CD inputs the data A103 to the memory die MD as the address data ADD.

At a timing t145, the control die CD inputs the data A104 to the memory die MD as the address data ADD.

At a timing t146, the control die CD inputs the data A105 to the memory die MD as the address data ADD.

At a timing t147, the control die CD inputs the data C104 to the memory die MD as the command data CMD. The data C104 is a command indicative of the termination of the input of the command set regarding the second read operation.

At the timing t148, the terminal RY//BY enters the "L" state from the "H" state and the access to the memory die MD is inhibited. The second read operation is performed in the memory die MD.

At a timing t149, the second read operation in the memory die MD terminates. Additionally, the terminal RY//BY enters the "H" state from the "L" state and the access to the memory die MD is permitted.

At a timing t150, the control die CD outputs the data D101 from the memory die MD. That is, in a state where "L" is input to the external control terminal CLE and "L" is input to the external control terminal ALE, the external control terminal /RE is risen from "L" to "H." In association with this, the voltages of the data input/output terminals I/O0 to I/O7 are set to "H" or "L" according to the respective bits of the data D101. The control die CD obtains the eight-bit data D101. The data D101 is eight-bit data among the user data read from the memory cell MC by the read operation.

At a timing t151, the control die CD outputs the data D102 from the memory die MD. The data D102 is eight-bit data among the user data read from the memory cell MC by the read operation. Similarly, the control die CD outputs the user data from the memory die MD in units of eights bits after that.

[Write Operation]

Next, the write operation of the semiconductor memory device according to the embodiment will be described.

Figure 11:
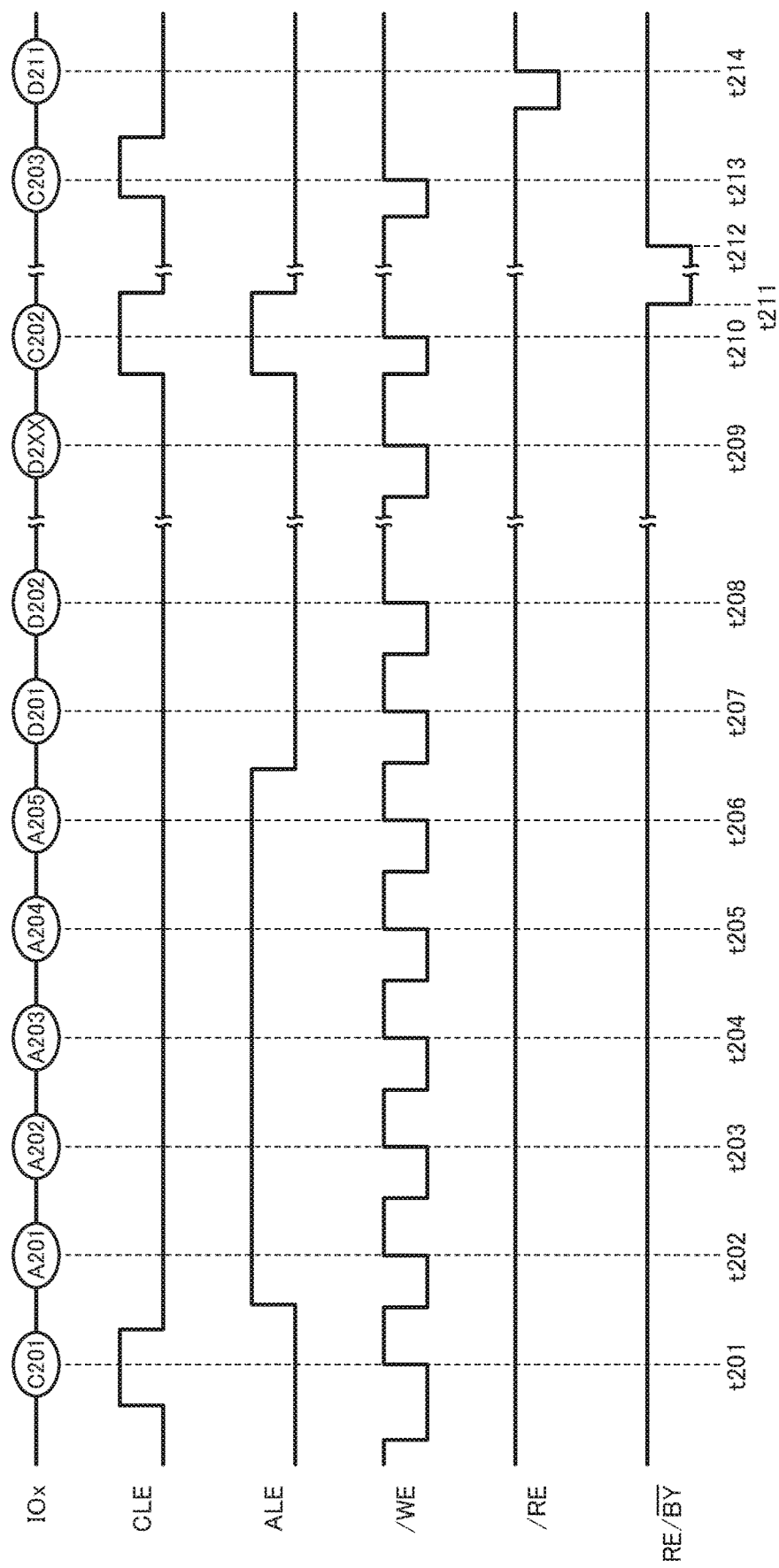
FIG. 11 is a timing chart to describe a write operation according to the first embodiment.

FIG. 11 is a timing chart to describe the write operation.

FIG. 11 exemplifies a command set input to the memory die MD in the write operation. This command set includes data C201, A201, A202, A203, A204, A205, D201, D202 to D2XX and data C202.

At a timing t201, the control die CD inputs the data C201 to the memory die MD as the command data CMD. The data C201 is a command input at the start of the write operation.

At a timing t202, the control die CD inputs the data A201 to the memory die MD as the address data ADD. The data A201 is a part of the column address CA.

At a timing t203, the control die CD inputs the data A202 to the memory die MD as the address data ADD. The data A202 is a part of the column address CA.

At a timing t204, the control die CD inputs the data A203 to the memory die MD as the address data ADD. The data A203 is a part of the row address RA. The data A203 includes, for example, a block address to identify the memory block BLK (FIG. 5) and a page address to identify the string unit SU and the word line WL.

At a timing t205, the control die CD inputs the data A204 to the memory die MD as the address data ADD. The data A204 is a part of the row address RA. The data A204 includes, for example, a block address and a page address.

At a timing t206, the control die CD inputs the data A205 to the memory die MD as the address data ADD. The data A205 includes a chip address to identify one memory die MD from the plurality of memory dies MD controlled by the control die CD.

At a timing t207, the control die CD inputs the data D201 to the memory die MD as the user data. That is, the voltages of the data input/output terminals I/O0 to I/O7 are set to "H" or "L" according to the respective bits of the data D201, and in a state where "L" is input to the external control terminal CLE and "L" is input to the external control terminal ALE, the external control terminal /WE is risen from "L" to "H." The data D201 is eight-bit data among the user data written to the memory cell MC by the write operation.

At a timing t208, the control die CD inputs the data D202 to the memory die MD as the user data. The data D202 is eight-bit data among the user data written to the memory cell MC by the write operation. Similarly, the control die CD inputs data as the user data to the memory die MD in units of eights bits after that.

At a timing t209, the control die CD inputs the data D2XX to the memory die MD as the user data. The data D2XX is eight-bit data among the user data written to the memory cell MC by the write operation.

At a timing t210, the control die CD inputs the data C202 to the memory die MD as the command data CMD. The data C202 is a command indicative of the termination of the input of the command set regarding the write operation.

At a timing t211, the terminal RY//BY enters the "L" state from the "H" state and the access to the memory die MD is inhibited. The write operation is performed in the memory die MD.

At a timing t212, the write operation in the memory die MD terminates. Additionally, the terminal RY//BY enters the "H" state from the "L" state and the access to the memory die MD is permitted.

At a timing t213, the control die CD inputs, for example, the data C203 to the memory die MD as the command data CMD. The data C203 is a command that requests an output of status data latched to the status register STR (FIG. 4).

At a timing t214, the control die CD outputs, for example, the data D211 from the memory die MD. The data D211 is the status data.

Figure 12:
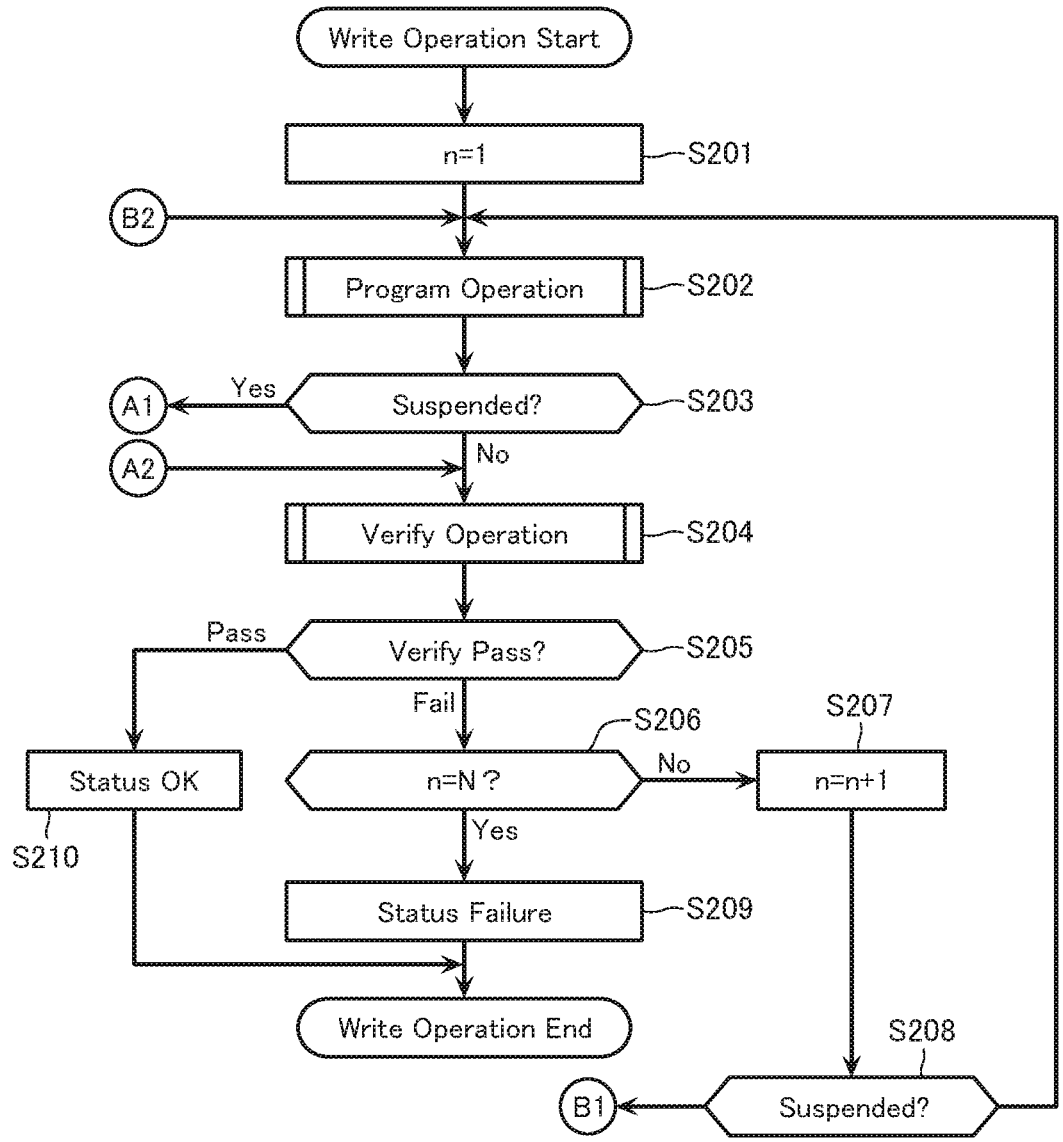
FIG. 12 is a flowchart to describe the write operation according to the first embodiment.
Figure 13:
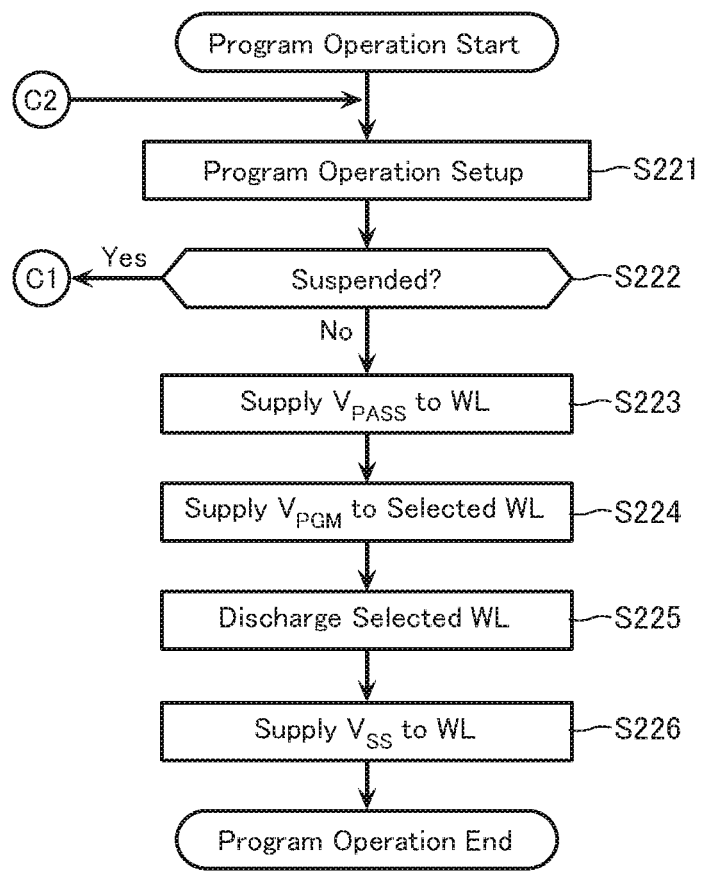
FIG. 13 is a flowchart to describe a program operation according to the first embodiment.
Figure 14:
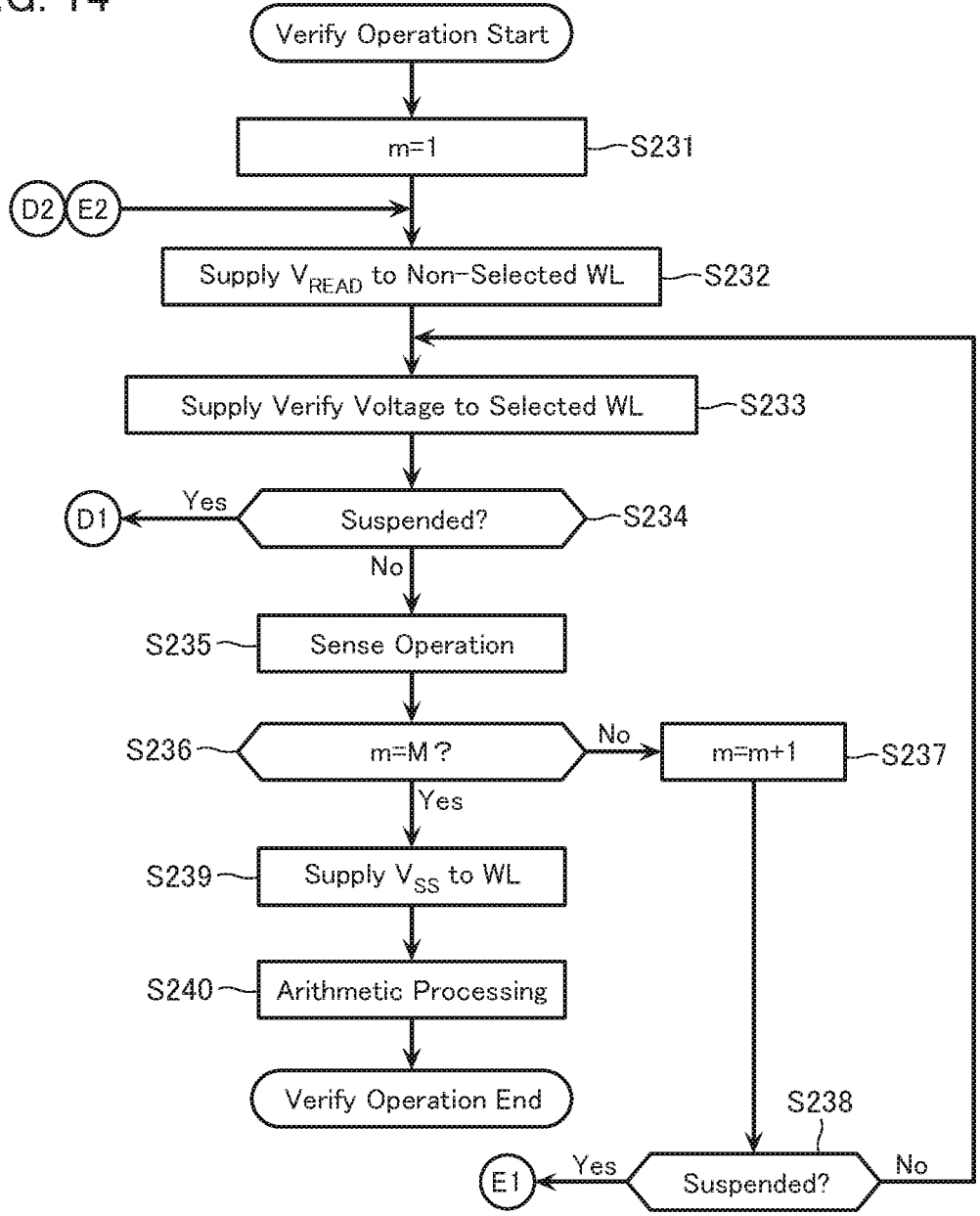
FIG. 14 is a flowchart to describe a verify operation according to the first embodiment.
Figure 15:
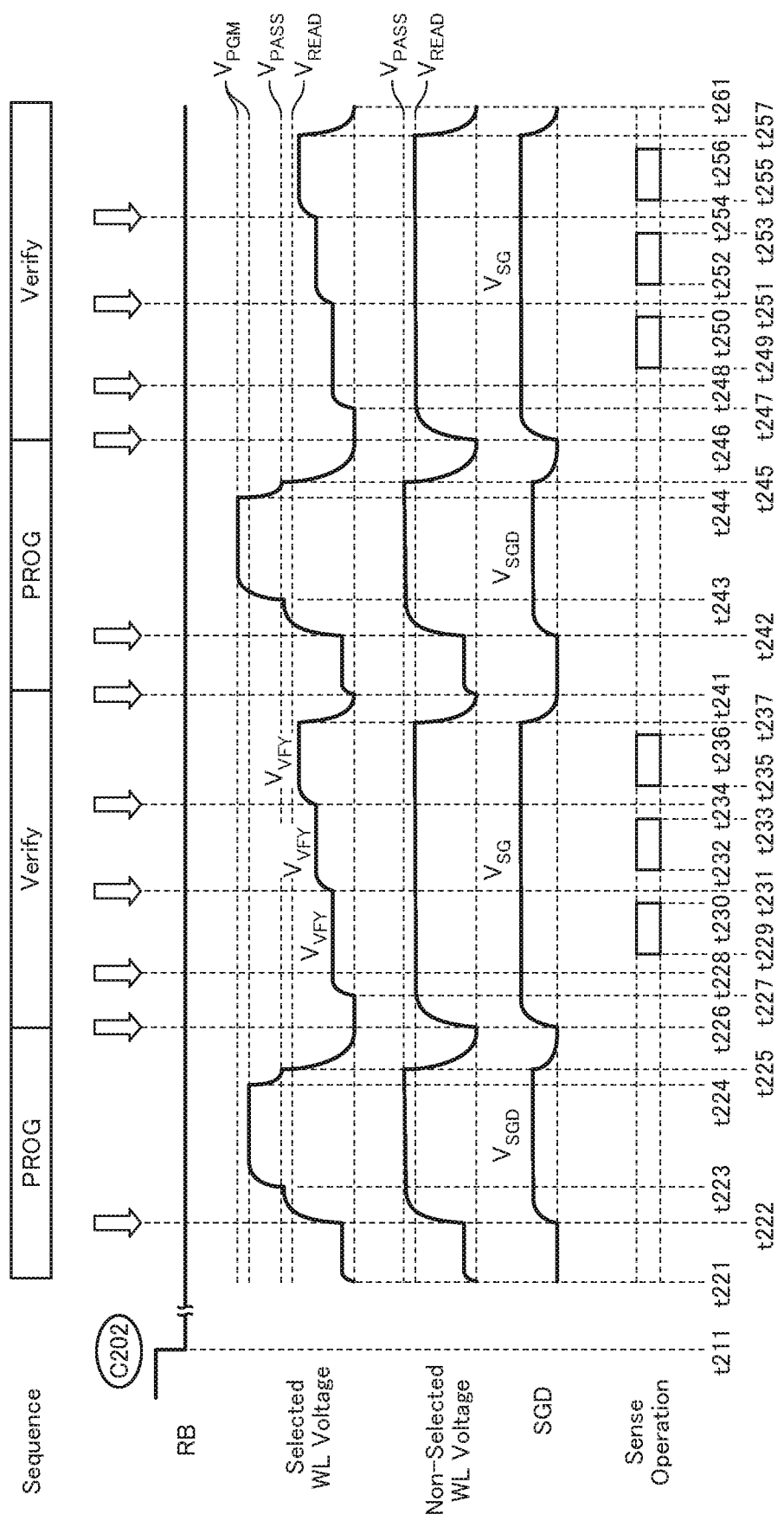
FIG. 15 is a timing chart to describe the write operation according to the first embodiment.

FIG. 12 is a flowchart to describe the write operation. FIG. 13 is a flowchart to describe a program operation included in the write operation. FIG. 14 is a flowchart to describe a verify operation included in the write operation. FIG. 15 is a timing chart to describe the write operation.

At Step S201, for example, as illustrated in FIG. 12, a variable n is set to 1. The variable n is a variable indicative of a write loop count. This operation is performed, for example, at the timing t211 in FIG. 15. For example, the user data written to the memory cell MC are latched to the latch circuits ADL, BDL, CDL, DDL in the sense amplifier unit SAU (FIG. 6).

At Step S202, the program operation is performed. The program operation is an operation that supplies the selected word line WL with the program voltage to increase the threshold voltage of the memory cell MC. This operation is performed, for example, from a timing t221 to a timing t226 and from a timing t241 to a timing t246 in FIG. 15.

At Step S203, whether to perform a suspend operation or not is determined. The suspend operation according to the embodiment is an operation that temporarily interrupts the write operation. When the suspend operation is performed, for example, the above-described first read operation, second read operation, and the like can be performed while the write operation is being interrupted. Additionally, when the first read operation, the second read operation, and the like end, the write operation can be resumed. The determination whether to perform the suspend operation or not may be performed by, for example, referring to the command register CMR by the sequencer SQC (FIG. 4) and confirming presence/absence of the command data CMD instructing the performing of the suspend operation. When the suspend operation is performed at Step S203, the write operation is resumed from Step S204. When the suspend operation is not performed, the process proceeds to Step S204.

At Step S204, the verify operation is performed. The verify operation is an operation to determine whether the threshold voltage of the selected memory cell MC has reached a desired magnitude or not. This operation is performed, for example, from a timing t226 to a timing t241 and from a timing t246 to a timing t261 in FIG. 15.

At Step S205, whether the threshold voltages of all of the selected memory cells MC or the selected memory cells MC at a certain proportion have reached target values or not is determined. When the threshold voltages are not reached, the determination is made as verify failure and the process proceeds to Step S206. When the threshold voltages are reached, the determination is made as verify pass and the process proceeds to Step S210.

At Step S206, whether the variable n has reached N (N is a natural number) or not is determined. When the variable n is not reached, the process proceeds to Step S207. When the variable n is reached, the process proceeds to Step S209.

At Step S207, 1 is added to the variable n. Additionally, a program voltage VPGM is increased in the voltage generation circuit VG (FIG. 5). Afterwards, the process proceeds to Step S208.

At Step S208, whether to perform the suspend operation or not is determined. When the suspend operation is performed, the write operation is resumed from Step S202. When the suspend operation is not performed, the process proceeds to Step S202.

At Step S209, data indicative of status failure is generated as the status data, and the data is latched to the status register STR (FIG. 4). Afterwards, the write operation is terminated.

At Step S210, data indicative of status OK is generated as the status data, and the data is latched to the status register STR (FIG. 4). Afterwards, the write operation is terminated.

Next, the program operation will be described with reference to FIG. 13 and FIG. 15.

At Step S221, a setup operation of the program operation is performed. For example, according to the data latched to the latch circuits ADL, BDL, CDL, DDL in the sense amplifier unit SAU (FIG. 6), the bit line BL connected to the memory cell MC where the threshold voltage is adjusted (hereinafter referred to as a "write bit line BL") is distinguished from the bit line BL connected to the memory cell MC where the adjustment of the threshold voltage is inhibited (hereinafter referred to as an "inhibited bit line BL"). A voltage around the ground voltage is supplied to the write bit line BL and a predetermined inhibition voltage is supplied to the inhibited bit line BL to adjust the voltage of the bit line BL. This operation is performed, for example, at the timings t221, t241 in FIG. 15.

At Step S222, whether to perform the suspend operation or not is determined. When the suspend operation is performed, the write operation is resumed from Step S221. When the suspend operation is not performed, the process proceeds to Step S223.

At Step S223, the write pass voltage $V_{PASS}$ is supplied to the selected word line WL and the non-selected word line WL. At Step S223, a voltage $V_{SGD}$ is supplied to the drain select lines SGD corresponding to the data A201 to A205. The voltage $V_{SGD}$ is smaller than the voltage $V_{SG}$, which has been described with reference to FIG. 9, and has a magnitude to the extent that the drain select transistor STD enters the ON state or the OFF state according to the voltages of the bit lines BL (FIG. 5). This operation is performed, for example, at timings t222, t242 in FIG. 15.

At Step S224, the program voltage VPGM is supplied to the selected word line WL. This operation is performed, for example, at timings t223, t243 in FIG. 15.

At Step S225, the selected word line WL is discharged. For example, the write pass voltage $V_{PASS}$ is supplied to the selected word line WL. This operation is performed, for example, at timings t224, t244 in FIG. 15.

At Step S226, the ground voltage $V_{SS}$ is supplied to the selected word line WL, the non-selected word line WL, and the drain select line SGD. This operation is performed, for example, at timings t225, t245 in FIG. 15. Afterwards, the program operation is terminated.

Next, with reference to FIG. 14 and FIG. 15, the verify operation will be described.

At Step S231, a variable m is set to 1. This operation is performed, for example, at the timings t226, t246 in FIG. 15.

At Step S232, the read pass voltage $V_{READ}$ is supplied to the non-selected word line WL. Additionally, at Step S232, the voltage $V_{SG}$ is supplied to the drain select line SGD and the source select line SGS corresponding to the data A201 to A205. This operation is performed, for example, at the timings t226, t246 in FIG. 15.

At Step S233, a verify voltage $V_{VFY}$ is supplied to the selected word line WL. This operation is performed, for example, at timings t227, t231, t234, t247, t251, t254 in FIG. 15.

At Step S234, whether to perform the suspend operation or not is determined. When the suspend operation is performed, the write operation is resumed from Step S232. When the suspend operation is not performed, the process proceeds to Step S235.

At Step S235, the sense operation is performed. The sense operation is performed, for example, at timings t229 to t230, t232 to t233, t235 to t236, t249 to t250, t252 to t253, and t255 to t256 in FIG. 15.

At Step S236, whether the variable m has reached M (M is a natural number) or not is determined. When the variable m is not reached, the process proceeds to Step S237. When the variable m is reached, the process proceeds to Step S239. Note that FIG. 15 exemplifies the case of M being 3.

At Step S237, 1 is added to the variable m. The verify voltage $V_{VFY}$ is increased or reduced in the voltage generation circuit VG (FIG. 5). Afterwards, the process proceeds to Step S238.

At Step S238, whether to perform the suspend operation or not is determined. When the suspend operation is performed, the write operation is resumed from Step S232. When the suspend operation is not performed, the process proceeds to Step S233.

At Step S239, the ground voltage $V_{SS}$ is supplied to the selected word line WL, the non-selected word line WL, and the select gate line (SGD, SGS). This operation is performed, for example, at timings t237, t257 in FIG. 15.

At Step S240, for example, based on the data latched by the latch circuit in the sense amplifier unit SAU, whether the threshold voltage in each memory cell MC has reached the target value or not is determined. The bit line BL connected to the memory cell MC where the threshold voltage reaches the target value is set as the inhibited bit line BL. In this case, the data latched by the latch circuits ADL, BDL, CDL, DDL in the sense amplifier unit SAU (FIG. 6) are updated. Additionally, at Step S240, the data latched by the latch circuits in the sense amplifier circuit SA may be transferred to a counter (not illustrated) via the wiring Ibus (FIG. 6) or the like. The counter may count the number of memory cells MC that reach the target value or may count the number of memory cells MC that do not reach the target value. Note that, at Step S205 in FIG. 12, the counting result by this counter (not illustrated) may be referred.

[Suspend Operation]

Figure 16:
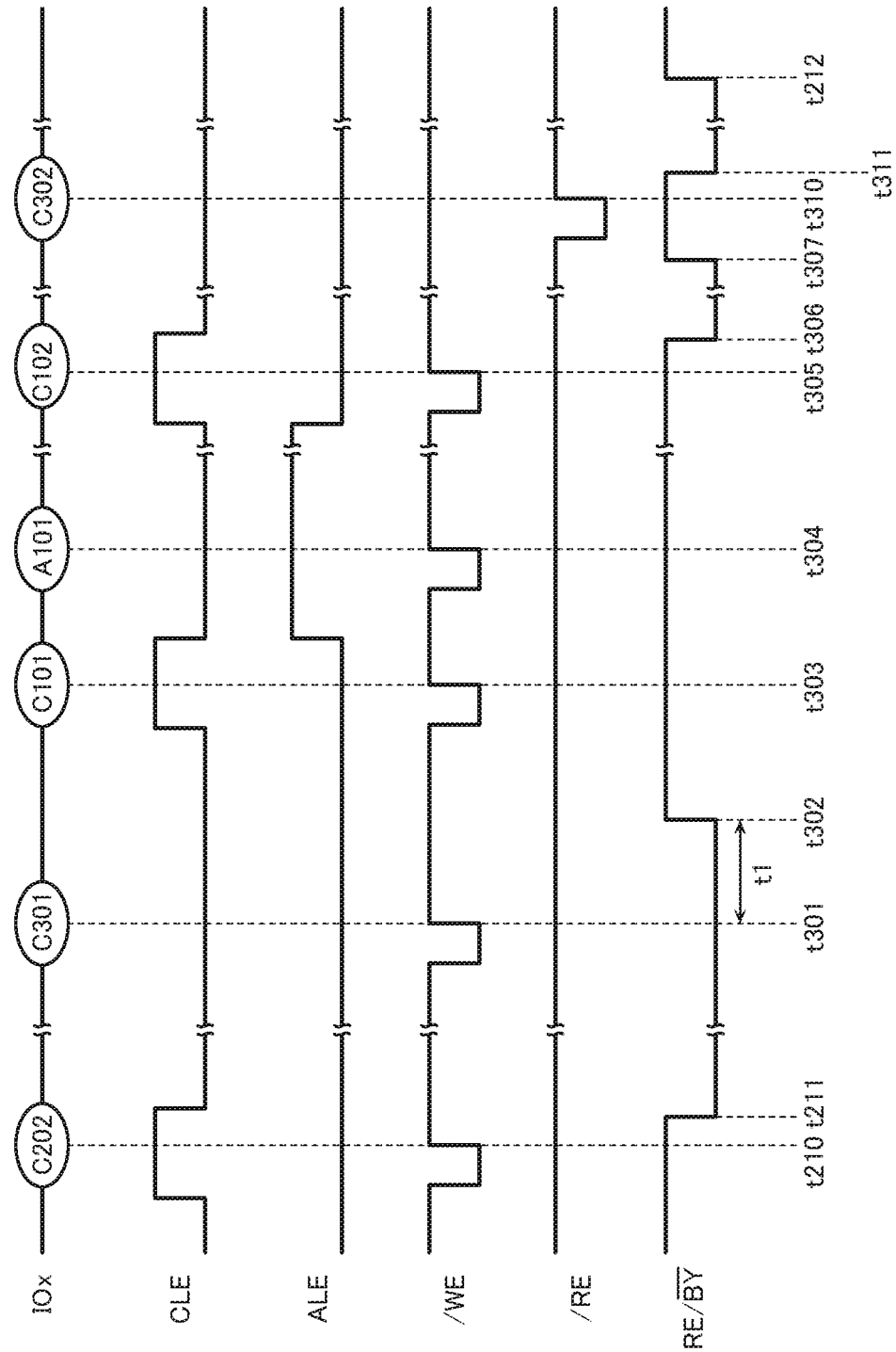
FIG. 16 is a timing chart to describe a suspend operation according to the first embodiment.

FIG. 16 is a timing chart to describe the suspend operation. Note that, in the following description, an example in which the write operation is interrupted (suspended) by the suspend operation and the first read operation is performed while the write operation is being interrupted will be described. However, the second read operation can be performed or both of the first read operation and the second read operation can be performed while the write operation is being interrupted.

As described above, the suspend operation according to the embodiment is an operation that temporarily interrupts the write operation. The suspend operation is performed, for example, between the timing t210 and the timing t212, which have been described with reference to FIG. 11.

At a timing t301, the control die CD inputs the data C301 to the memory die MD as the command data CMD. The data C301 is a command input when the write operation is interrupted. Note that the data C301 is a command that can be input even when the terminal RY//BY is in the "L" state.

At a timing t302, the terminal RY//BY enters the "H" state from the "L" state and the access to the memory die MD is permitted.

From a timing t303 to a timing t305, a command set (the data C101, A101, A102, A103, A104, A105 and the data C102, see FIG. 7) input to the memory die MD is input in the first read operation.

At a timing t306, the terminal RY//BY enters the "L" state from the "H" state and the access to the memory die MD is inhibited. The first read operation is performed in the memory die MD.

At a timing t307, the first read operation in the memory die MD terminates. Additionally, the terminal RY//BY enters the "H" state from the "L" state and the access to the memory die MD is permitted.

At a timing t310, the control die CD inputs the data C302 to the memory die MD as the command data CMD. The data C302 is a command input when the write operation is resumed.

At a timing t311, the terminal RY//BY enters the "L" state from the "H" state and the access to the memory die MD is inhibited. The write operation is resumed in the memory die MD.

Next, with reference to FIG. 17 to FIG. 24, the suspend operation of the semiconductor memory device according to the embodiment will be described in more detail. Note that, in FIG. 17 to FIG. 24, while waveforms of the selected word line WL and the non-selected word line WL are overlappingly illustrated, the selected word line WL of the write operation and the selected word line WL of the read operation may differ or may correspond to the different memory blocks BLK (FIG. 5). The waveforms as exemplified in FIG. 17 to FIG. 24 may be obtained by, for example, measuring the voltages of the wirings CG or the like, which have been described with reference to FIG. 5.

Figure 17:
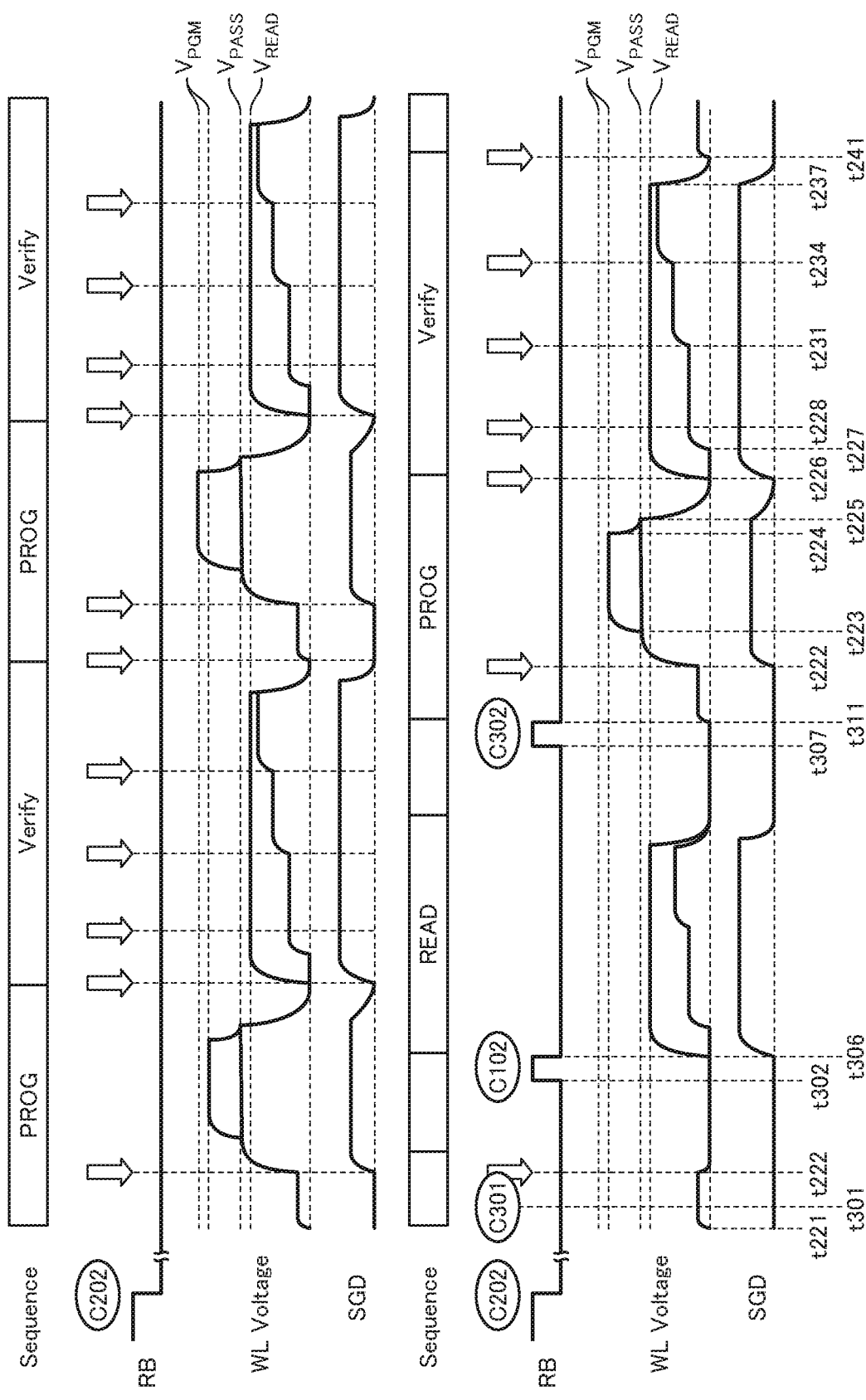
FIG. 17 is a timing chart to describe the suspend operation according to the first embodiment.

FIG. 17 is a timing chart to describe the suspend operation performed when the data C301 is input between the timing t221 and the timing t222 in FIG. 15.

When the data C301 is input at any input timing between the timing t221 and the timing t222, determination for performing the suspend operation is performed at Step S222 in FIG. 13. Thus, the write operation is interrupted at the timing t222 and a recovery operation is performed. The recovery operation supplies, for example, a voltage with a magnitude around the ground voltage $V_{SS}$ to the bit line BL, the word line WL, the select gate line (SGD, SGS), and the like (FIG. 5). For example, a voltage with a magnitude around the ground voltage $V_{SS}$ is supplied to the operating voltage output terminal 31 in the voltage generation circuit VG (FIG. 5) or the like.

In the illustrated example, before the supply of the write pass voltage $V_{PASS}$ to the word line WL starts, a voltage with a magnitude around the ground voltage $V_{SS}$ is supplied to the word line WL.

From the timing t306 to the timing t307, the first read operation is performed as described above.

The write operation is resumed at the timing t311. Note that from when the write operation is interrupted until the write operation is resumed, the variable n of FIG. 12 and the variable m of FIG. 14 are held in, for example, a register (not illustrated). Therefore, at the timing t311, Step S221 in the n-th write loop of the write operation is started. For example, when the data C301 is input again before the process of Step S221 terminates after the write operation is resumed, for example, determination for performing the suspend operation again is performed at Step S222 in FIG. 13.

Figure 18:
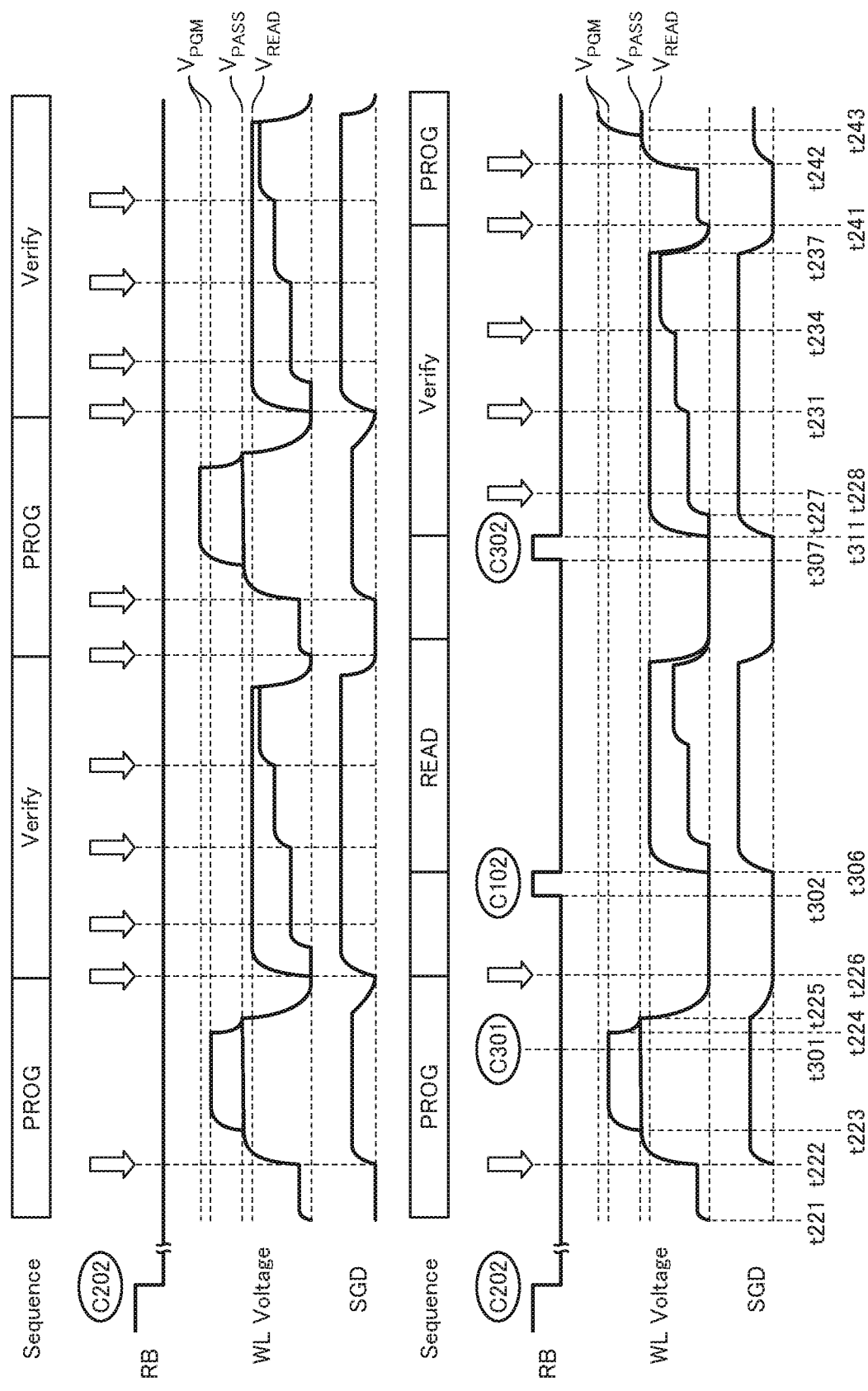
FIG. 18 is a timing chart to describe the suspend operation according to the first embodiment.

FIG. 18 is a timing chart to describe the suspend operation performed when the data C301 is input between the timing t222 and the timing t226 in FIG. 15.

When the data C301 is input at any input timing between the timing t222 and the timing t226, at Step S203 in FIG. 12, determination for performing the suspend operation is performed. Accordingly, the write operation is interrupted at the timing t226 and the recovery operation is performed.

From the timing t306 to the timing t307, the first read operation is performed as described above.

The write operation is resumed at the timing t311. Note that from when the write operation is interrupted until the write operation is resumed, the variable n of FIG. 12 and the variable m of FIG. 14 are held in, for example, the register (not illustrated). Therefore, at the timing t311, Step S204 in the n-th write loop of the write operation is started.

Figure 19:
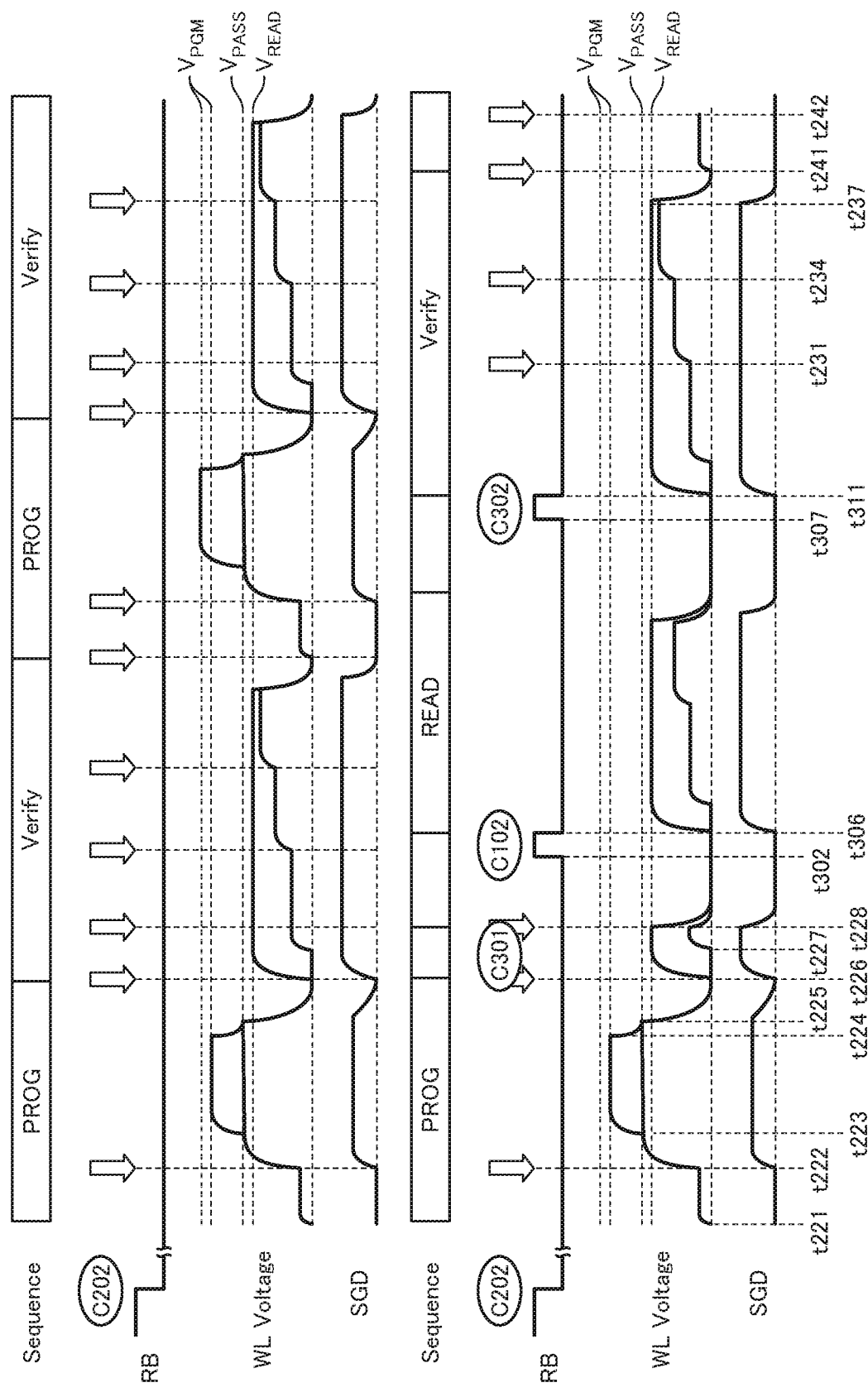
FIG. 19 is a timing chart to describe the suspend operation according to the first embodiment.

FIG. 19 is a timing chart to describe the suspend operation performed when the data C301 is input between the timing t226 and the timing t228 in FIG. 15.

When the data C301 is input at any input timing between the timing t226 and the timing t228, determination for performing the suspend operation is performed at Step S234 in FIG. 14. Thus, the write operation is interrupted at the timing t228 and the recovery operation is performed.

In the illustrated example, before the sense operation is performed, a voltage with a magnitude around the ground voltage $V_{SS}$ is supplied to the word line WL and the select gate line (SGD, SGS). Therefore, different from the case where the write operation is not interrupted, the period during which the verify voltage $V_{VFY}$ is supplied to the selected word line WL is shorter than the period from the timing t227 to the timing t231. Additionally, the period during which the read pass voltage $V_{READ}$ is supplied to the non-selected word line WL and the period during which the voltage $V_{SG}$ is supplied to the select gate line (SGD, SGS) are shorter than the period from the timing t226 to the timing t237.

As described above, the first read operation is performed from the timing t306 to the timing t307.

The write operation is resumed at the timing t311. Note that from when the write operation is interrupted until the write operation is resumed, the variable n of FIG. 12 and the variable m (=1) of FIG. 14 are held in, for example, the register (not illustrated). Therefore, at the timing t311, Step S232, which is a process corresponding to the 1st verify voltage in the n-th write loop of the write operation, is started. For example, when the data C301 is input again before the process of Step S233 terminates after the write operation is resumed, for example, determination for performing the suspend operation again is performed at Step S234 in FIG. 14.

Figure 20:
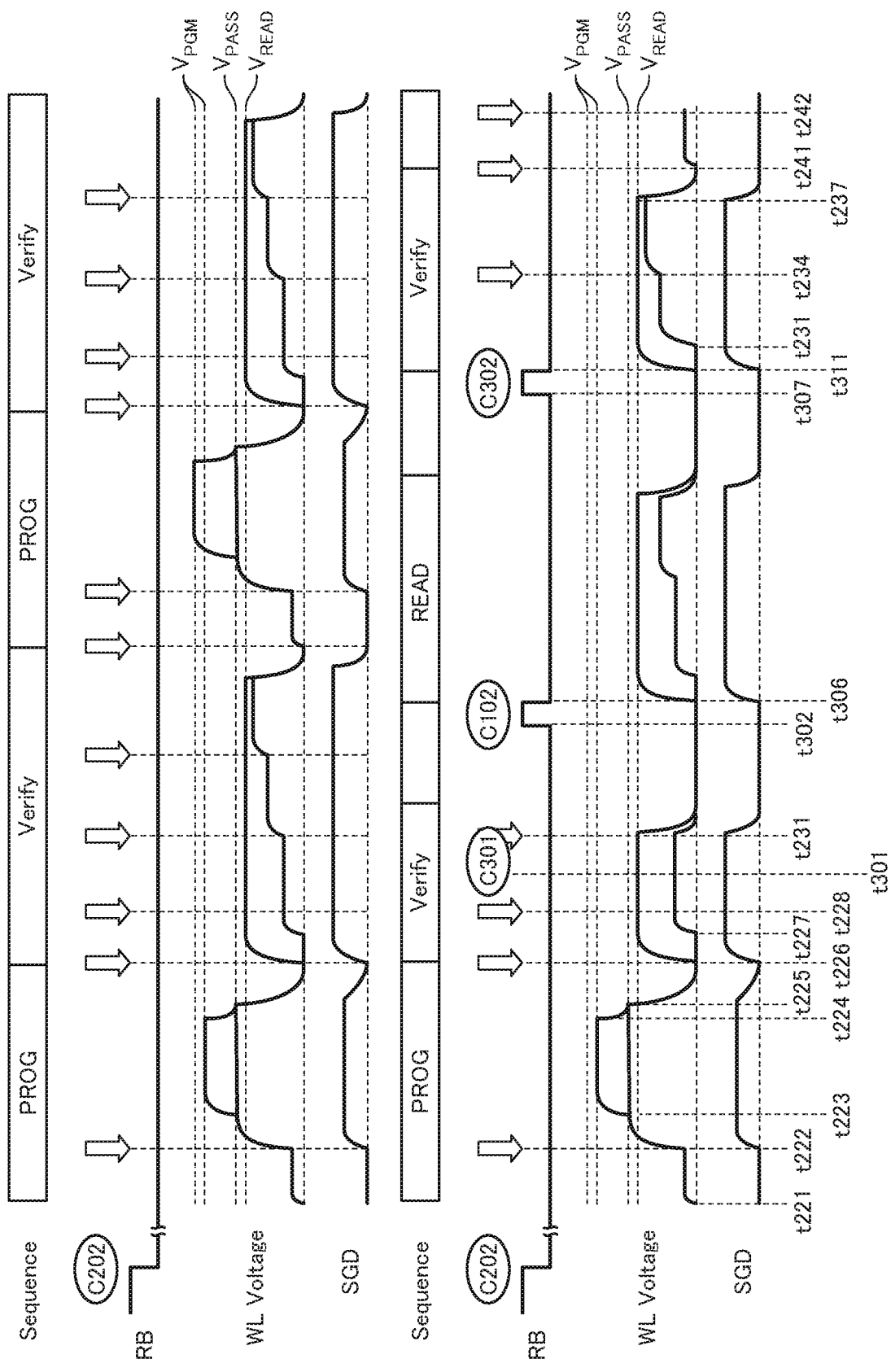
FIG. 20 is a timing chart to describe the suspend operation according to the first embodiment.

FIG. 20 is a timing chart to describe the suspend operation performed when the data C301 is input between the timing t228 and the timing t231 in FIG. 15.

When the data C301 is input at any input timing between the timing t228 and the timing t231, determination for performing the suspend operation is performed at Step S238 in FIG. 14. Thus, the write operation is interrupted at the timing t231 and the recovery operation is performed.

In the illustrated example, before the verify voltage $V_{VFY}$ is adjusted, a voltage with a magnitude around the ground voltage $V_{SS}$ is supplied to the word line WL and the select gate line (SGD, SGS). Therefore, different from the case where the write operation is not interrupted, the period during which the read pass voltage $V_{READ}$ is supplied to the non-selected word line WL and the period during which the voltage $V_{SG}$ is supplied to the select gate line (SGD, SGS) are shorter than the period from the timing t226 to the timing t237.

From the timing t306 to the timing t307, the first read operation is performed as described above.

The write operation is resumed at the timing t311. Note that from when the write operation is interrupted until the write operation is resumed, the variable n of FIG. 12 and the variable m (=2) of FIG. 14 are held in, for example, the register (not illustrated). Therefore, at the timing t311, Step S232, which is a process corresponding to the 2nd verify voltage in the n-th write loop of the write operation, is started.

Figure 21:
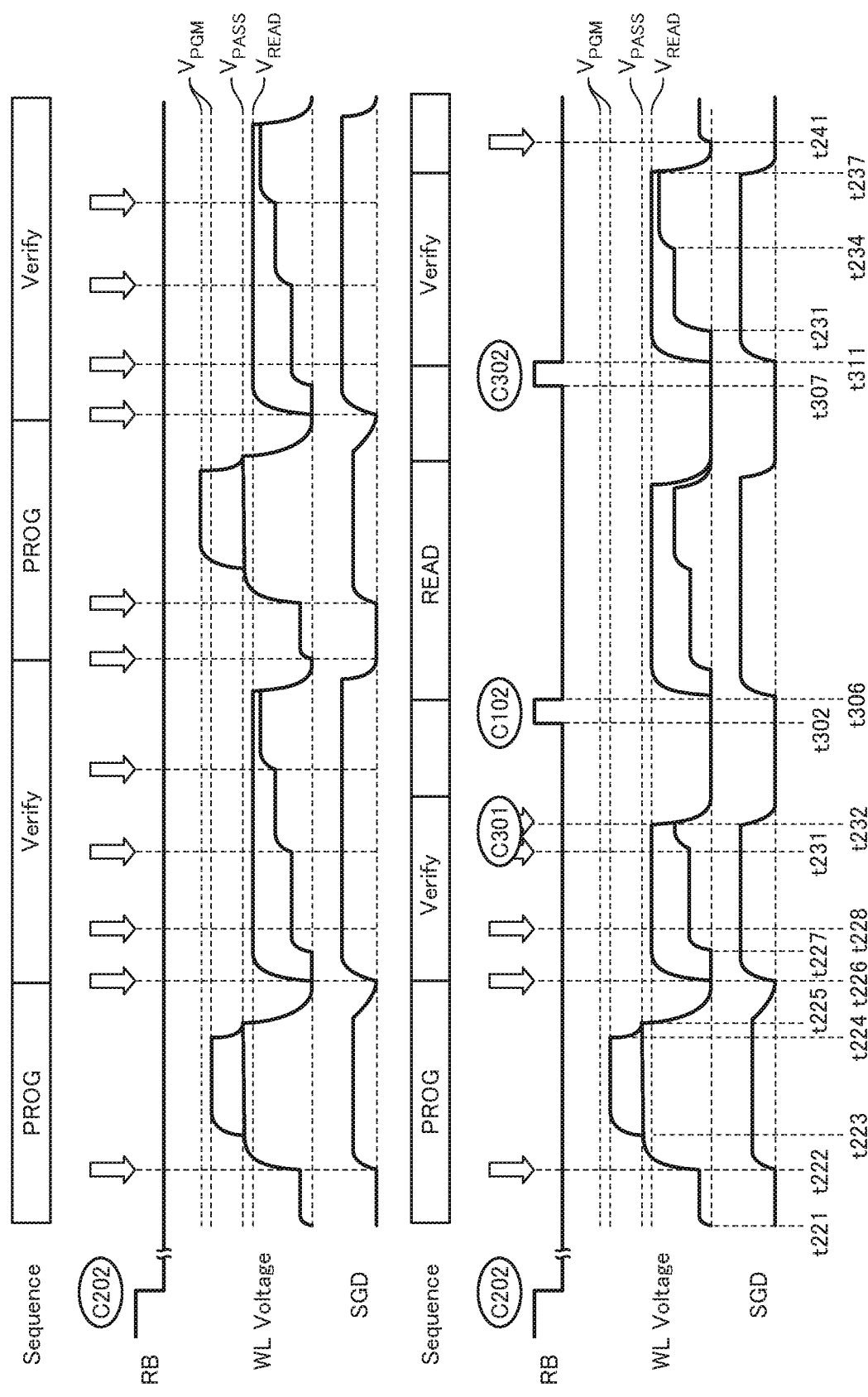
FIG. 21 is a timing chart to describe the suspend operation according to the first embodiment.

FIG. 21 is a timing chart to describe the suspend operation performed when the data C301 is input between the timing t231 and the timing t232 in FIG. 15.

When the data C301 is input at any input timing between the timing t231 and the timing t232, determination for performing the suspend operation is performed at Step S234 in FIG. 14. Thus, the write operation is interrupted at the timing t232 and the recovery operation is performed.

In the illustrated example, before the sense operation is performed, a voltage with a magnitude around the ground voltage $V_{SS}$ is supplied to the word line WL and the select gate line (SGD, SGS). Therefore, different from the case where the write operation is not interrupted, the period during which the verify voltage $V_{VFY}$ is supplied to the selected word line WL is shorter than the period from the timing t231 to the timing t234. Additionally, the period during which the read pass voltage $V_{READ}$ is supplied to the non-selected word line WL and the period during which the voltage $V_{SG}$ is supplied to the select gate line (SGD, SGS) are shorter than the period from the timing t226 to the timing t237.

As described above, the first read operation is performed from the timing t306 to the timing t307.

The write operation is resumed at the timing t311. Note that from when the write operation is interrupted until the write operation is resumed, the variable n of FIG. 12 and the variable m (=2) of FIG. 14 are held in, for example, the register (not illustrated). Therefore, at the timing t311, Step S232, which is a process corresponding to the 2nd verify voltage in the n-th write loop of the write operation, is started. For example, when the data C301 is input again before the process of Step S233 terminates after the write operation is resumed, for example, determination for performing the suspend operation again is performed at Step S234 in FIG. 14.

Figure 22:
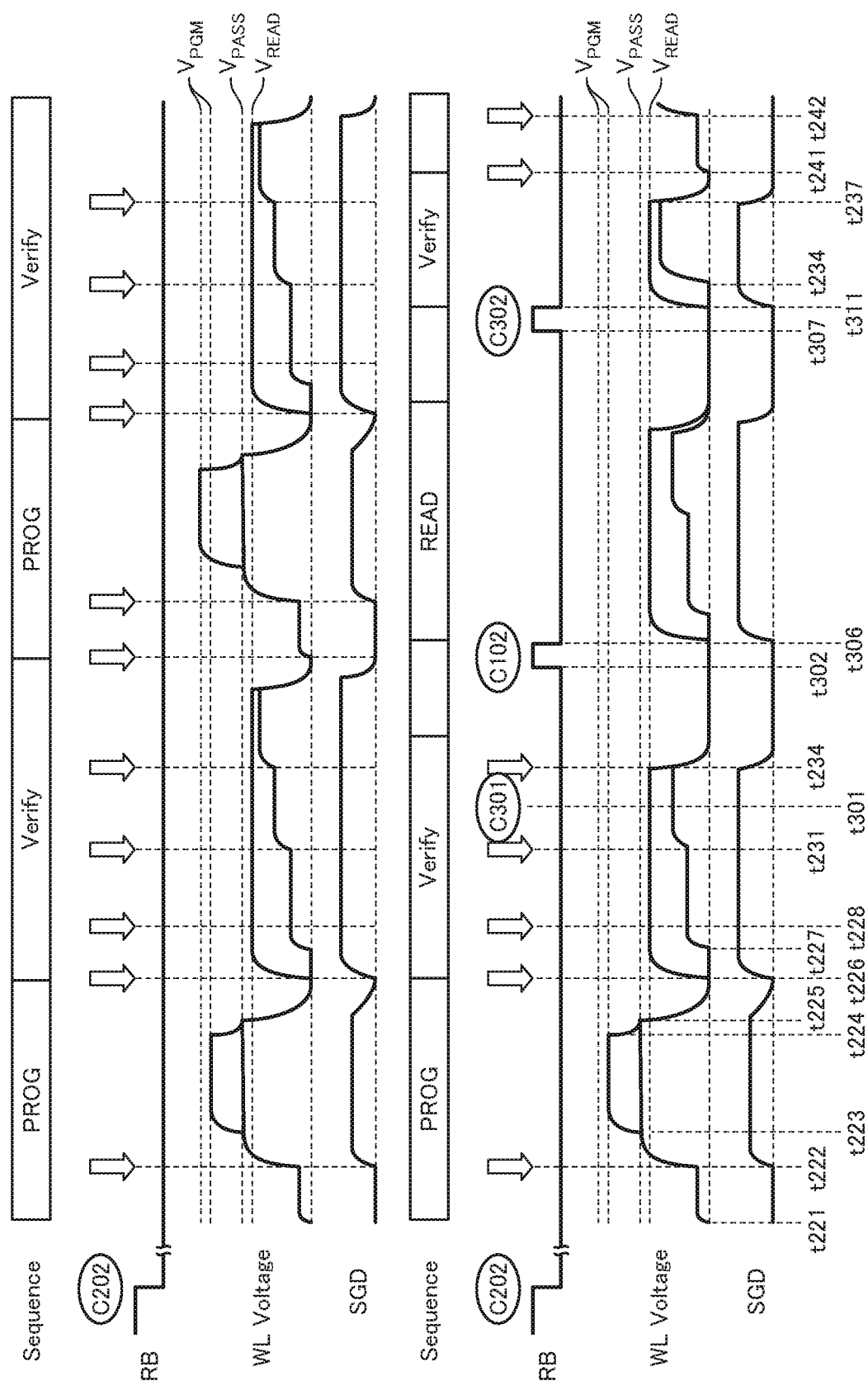
FIG. 22 is a timing chart to describe the suspend operation according to the first embodiment.

FIG. 22 is a timing chart to describe the suspend operation performed when the data C301 is input between the timing t232 and the timing t234 in FIG. 15.

When the data C301 is input at any input timing between the timing t232 and the timing t234, determination for performing the suspend operation is performed at Step S238 in FIG. 14. Thus, the write operation is interrupted at the timing t234 and the recovery operation is performed.

In the illustrated example, before the verify voltage $V_{VFY}$ is adjusted, a voltage with a magnitude around the ground voltage $V_{SS}$ is supplied to the word line WL and the select gate line (SGD, SGS). Therefore, different from the case where the write operation is not interrupted, the period during which the read pass voltage $V_{READ}$ is supplied to the non-selected word line WL and the period during which the voltage $V_{SG}$ is supplied to the select gate line (SGD, SGS) are shorter than the period from the timing t226 to the timing t237.

From the timing t306 to the timing t307, the first read operation is performed as described above.

The write operation is resumed at the timing t311. Note that from when the write operation is interrupted until the write operation is resumed, the variable n of FIG. 12 and the variable m (=3) of FIG. 14 are held in, for example, the register (not illustrated). Therefore, at the timing t311, Step S232, which is a process corresponding to the 3rd verify voltage in the n-th write loop of the write operation, is started.

Figure 23:
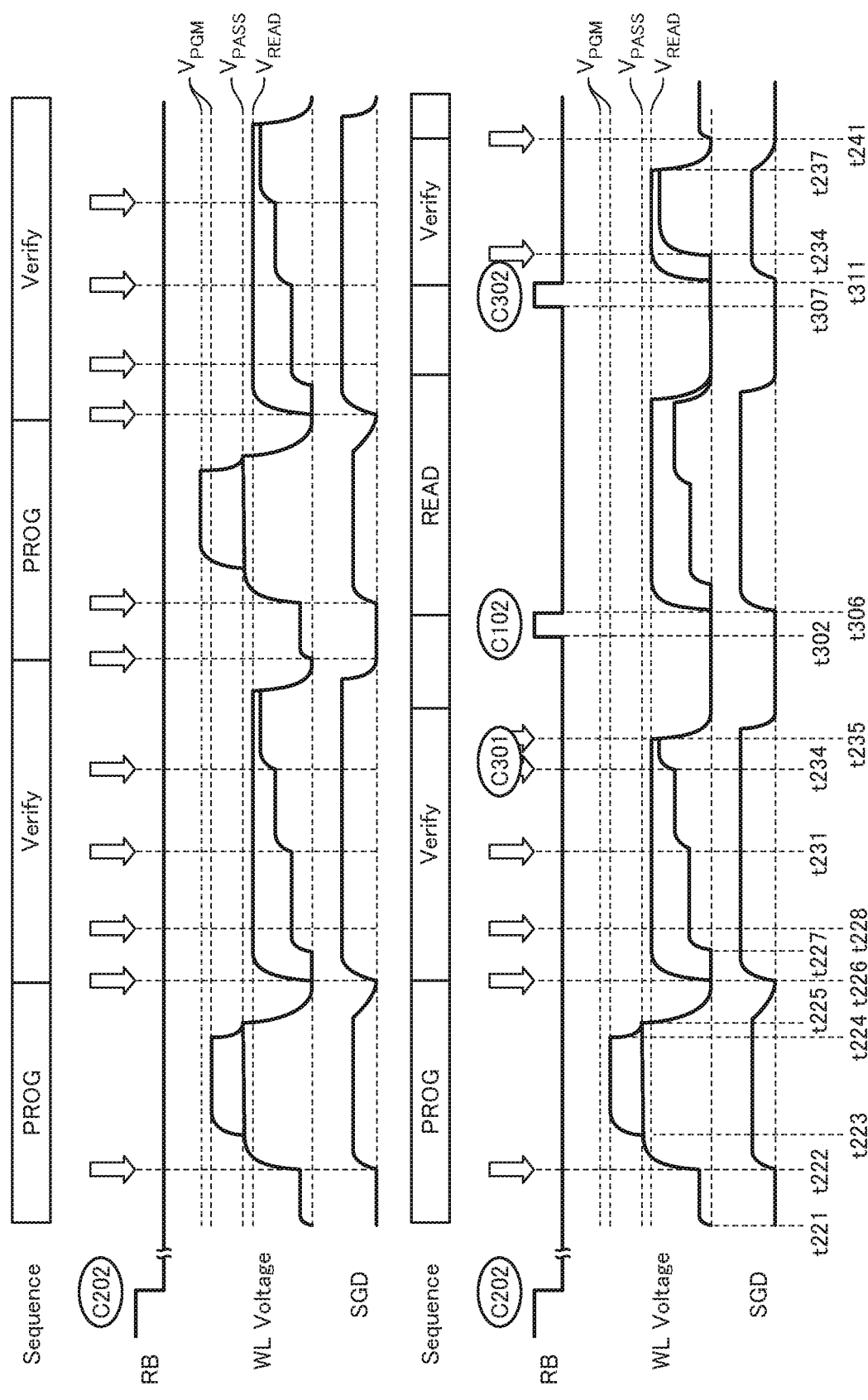
FIG. 23 is a timing chart to describe the suspend operation according to the first embodiment.

FIG. 23 is a timing chart to describe the suspend operation performed when the data C301 is input between the timing t234 and the timing t235 in FIG. 15.

When the data C301 is input at any input timing between the timing t234 and the timing t235, determination for performing the suspend operation is performed at Step S234 in FIG. 14. Thus, the write operation is interrupted at the timing t235 and the recovery operation is performed.

In the illustrated example, before the sense operation is performed, a voltage with a magnitude around the ground voltage $V_{SS}$ is supplied to the word line WL and the select gate line (SGD, SGS). Therefore, different from the case where the write operation is not interrupted, the period during which the verify voltage $V_{VFY}$ is supplied to the selected word line WL is shorter than the period from the timing t234 to the timing t237. Additionally, the period during which the read pass voltage $V_{READ}$ is supplied to the non-selected word line WL and the period during which the voltage $V_{SG}$ is supplied to the select gate line (SGD, SGS) are shorter than the period from the timing t226 to the timing t237.

As described above, the first read operation is performed from the timing t306 to the timing t307.

The write operation is resumed at the timing t311. Note that from when the write operation is interrupted until the write operation is resumed, the variable n of FIG. 12 and the variable m (=3) of FIG. 14 are held in, for example, the register (not illustrated). Therefore, at the timing t311, Step S232, which is a process corresponding to the 3rd verify voltage in the n-th write loop of the write operation, is started. For example, when the data C301 is input again before the process of Step S233 terminates after the write operation is resumed, determination for performing the suspend operation again is performed at Step S234 in FIG. 14.

Figure 24:
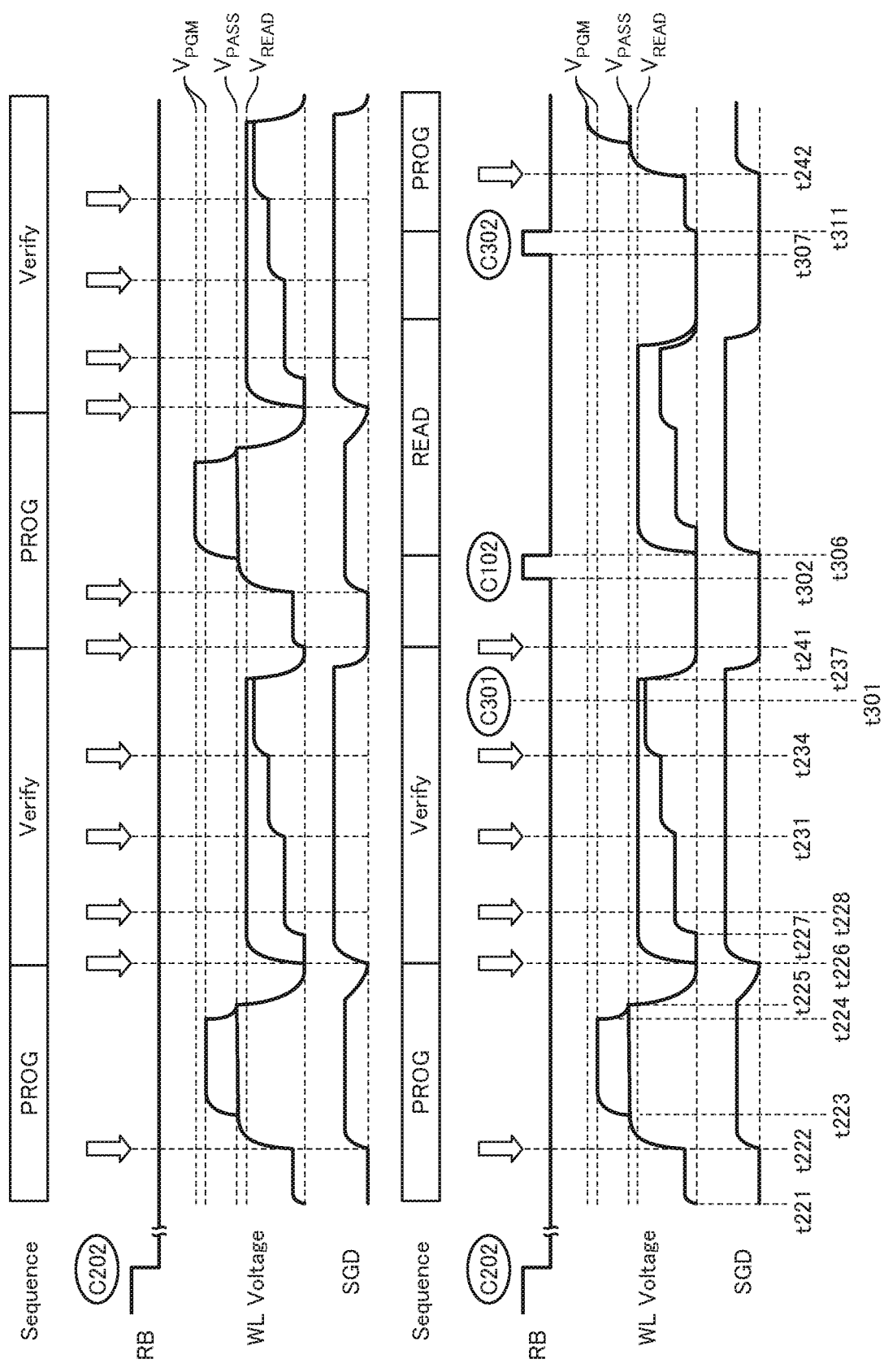
FIG. 24 is a timing chart to describe the suspend operation according to the first embodiment.

FIG. 24 is a timing chart to describe the suspend operation performed when the data C301 is input between the timing t235 and the timing t241 in FIG. 15.

When the data C301 is input at any input timing between the timing t235 and the timing t241, determination for performing the suspend operation is performed at Step S208 in FIG. 12. Thus, the write operation is interrupted at the timing t241 and the recovery operation is performed.

From the timing t306 to the timing t307, the first read operation is performed as described above.

The write operation is resumed at the timing t311. Note that from when the write operation is interrupted until the write operation is resumed, the variable n of FIG. 12 and the variable m of FIG. 14 are held in, for example, the register (not illustrated). Therefore, at the timing t311, Step S221 in the n-th write loop of the write operation is started.

The case where the data C301 is input at any input timing between the timing t221 and the timing t241 in the write operation has been described above. Here, even when the data C301 is input at an input timing other than these timings in the write operation, in a case where the data C301 is input at the input timing corresponding to any of the above-described input timings, the suspend operation is performed at the step similar to the above-described steps.

Figure 25:
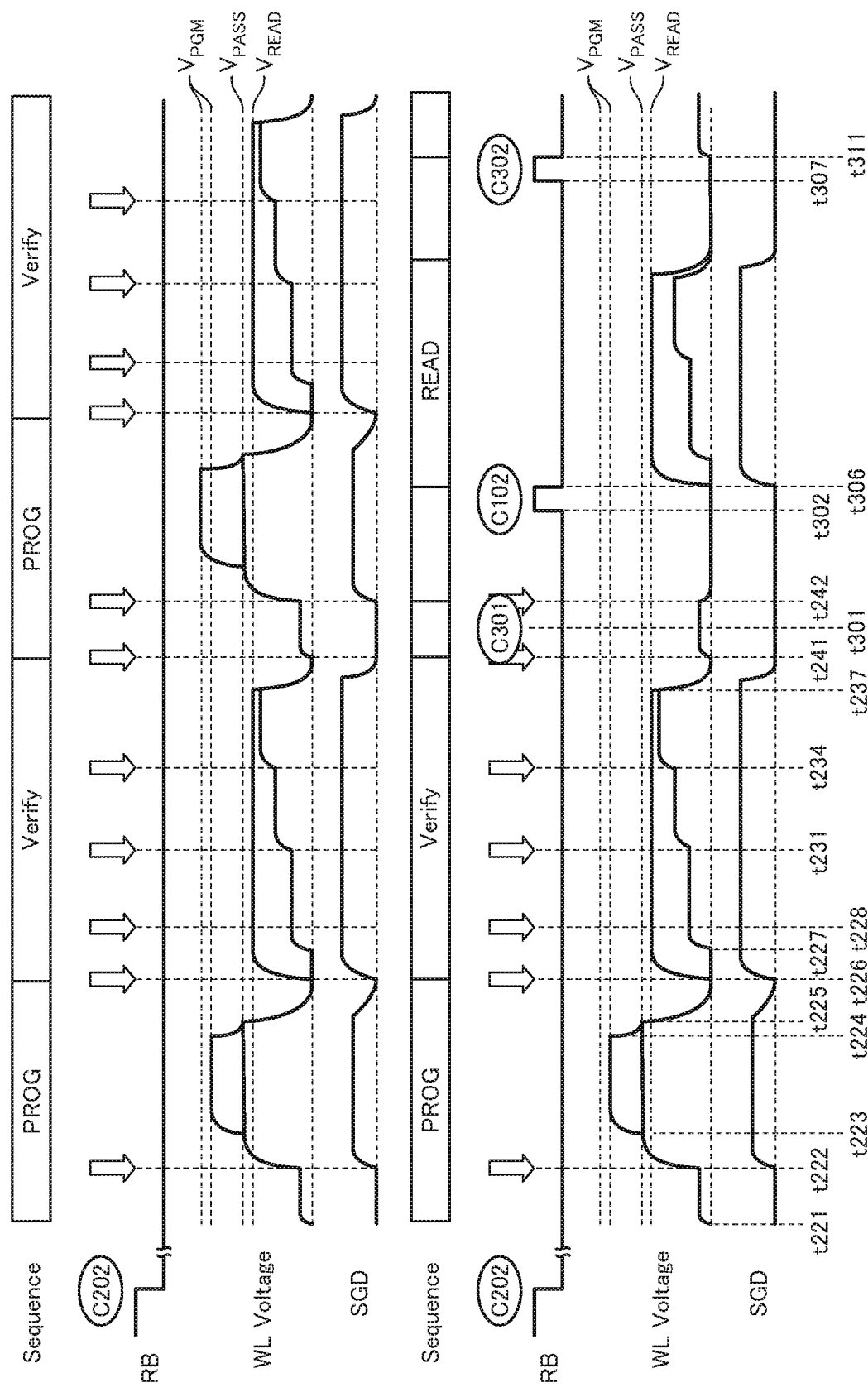
FIG. 25 is a timing chart to describe the suspend operation according to the first embodiment.

For example, FIG. 25 is a timing chart to describe the suspend operation performed when the data C301 is input between the timing t241 and the timing t242 in FIG. 15. The timing from the timing t241 to the timing t242 corresponds to the timing from the timing t221 to the timing t222. Therefore, when the data C301 is input at any input timing between the timing t241 and the timing t242, similarly to the case where the data C301 is input between the timing t221 and the timing t222, the determination for performing the suspend operation is performed at Step S222 in FIG. 13. Thus, the write operation is interrupted at the timing t242 and the recovery operation is performed.

[Effects of First Embodiment]

For example, as described with reference to FIG. 16, to perform the suspend operation in the first embodiment, the control die CD inputs the data C301 to the memory die MD as the command data CMD at the timing t301 during the write operation. Additionally, at the subsequent timing t302, the terminal RY//BY enters the "H" state from the "L" state and the access to the memory die MD is permitted. Hereinafter, the period from the timing t301 to the timing t302 may be referred to as a waiting time t1.

In association with an increased speed of the semiconductor memory device, the waiting time t1 has been desired to be shortened. To shorten the waiting time t1, for example, it is considered to perform the determination process of the suspension operation multiple times in the write operation.

Here, for example, in the example described with reference to FIG. 15, the program operation is performed from the timing t221 to the timing t226. There may be a case that the process in the period from the timing t221 to the timing t226 becomes a process requiring comparatively long time among the plurality of processes included in the write operation. Therefore, to shorten the waiting time t1, for example, it is considered to perform the determination process of suspend operation between the timing t223 and the timing t224.

However, between the timing t223 and the timing t224, the program voltage VPGM is supplied to the selected word line WL and the threshold voltage of the memory cell MC changes. When the process is performed divided into two times, the aspect of change in threshold voltage of the memory cell MC differs, and this possibly results in deterioration of reliability in the memory cell MC. Moreover, the applied count of a high voltage to the memory cell MC increases, and this possibly results in deterioration of service life of the memory cell MC.

Therefore, in the semiconductor memory device according to the first embodiment, for example, as described with reference to FIG. 17, when the data C301 is input as the command data CMD between the timing t221 at which the program operation is started and the timing t222 at which the supply of the write pass voltage $V_{PASS}$ is started, the suspend operation is performed at the timing t222.

Moreover, in the semiconductor memory device according to the first embodiment, for example, as described with reference to FIG. 18, when the data C301 is input as the command data CMD between the timing t222 at which the supply of the write pass voltage $V_{PASS}$ is started and the timing t226 at which the program operation terminates, the suspend operation is performed at the timing t226.

With such an aspect, there may be a case where the waiting time t1 can be shortened while the deterioration of the reliability in the memory cell MC and the decrease in service life of the memory cell MC are reduced.

Additionally, in the semiconductor memory device according to the first embodiment, for example, as described with reference to FIG. 19, FIG. 21, FIG. 23, and the like, when the data C301 is input as the command data CMD between the timing t226 at which the verify operation is started or the timings t231, t234 at which the supply of the verify voltage is started and the timings t228, t232, t235 before the sense operation is started, the suspend operation is performed at the timings t228, t232, t235.

With such an aspect, there may be a case where the waiting time t1 can be shortened.

Second Embodiment

Next, a semiconductor memory device according to the second embodiment will be described. The semiconductor memory device according to the second embodiment is configured basically similar to the semiconductor memory device according to the first embodiment. However, the semiconductor memory device according to the second embodiment differs in, for example, a part of processes included in the write operation and the suspend operation.

Figure 26:
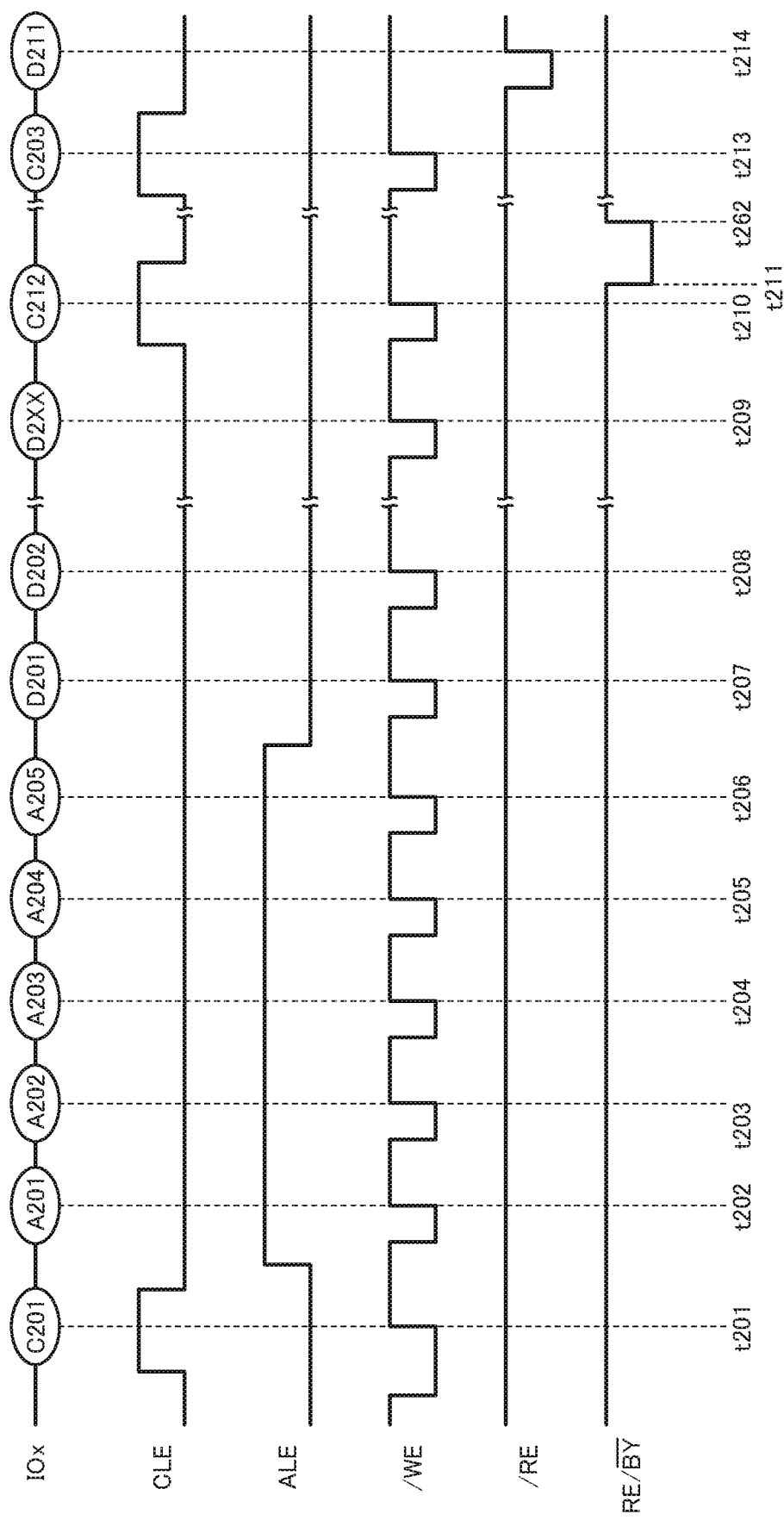
FIG. 26 is a timing chart to describe a write operation according to the second embodiment.

FIG. 26 is a timing chart to describe the write operation.

FIG. 26 exemplifies a command set input to the memory die MD to perform the write operation. While this command set is basically similar to the command set of FIG. 11, this command set includes data C212 instead of the data C202.

In the example of FIG. 26, the command set is input by the aspect basically similar to that of the example of FIG. 11. However, at the timing t210, the data C212 is input instead of the data C202. Further, at the timing t211, the terminal RY//BY enters the "L" state from the "H" state. However, the terminal RY//BY enters the "H" state from the "L" state at a timing t262 immediately after that, and the write operation is started after that (see FIG. 28).

Figure 27:
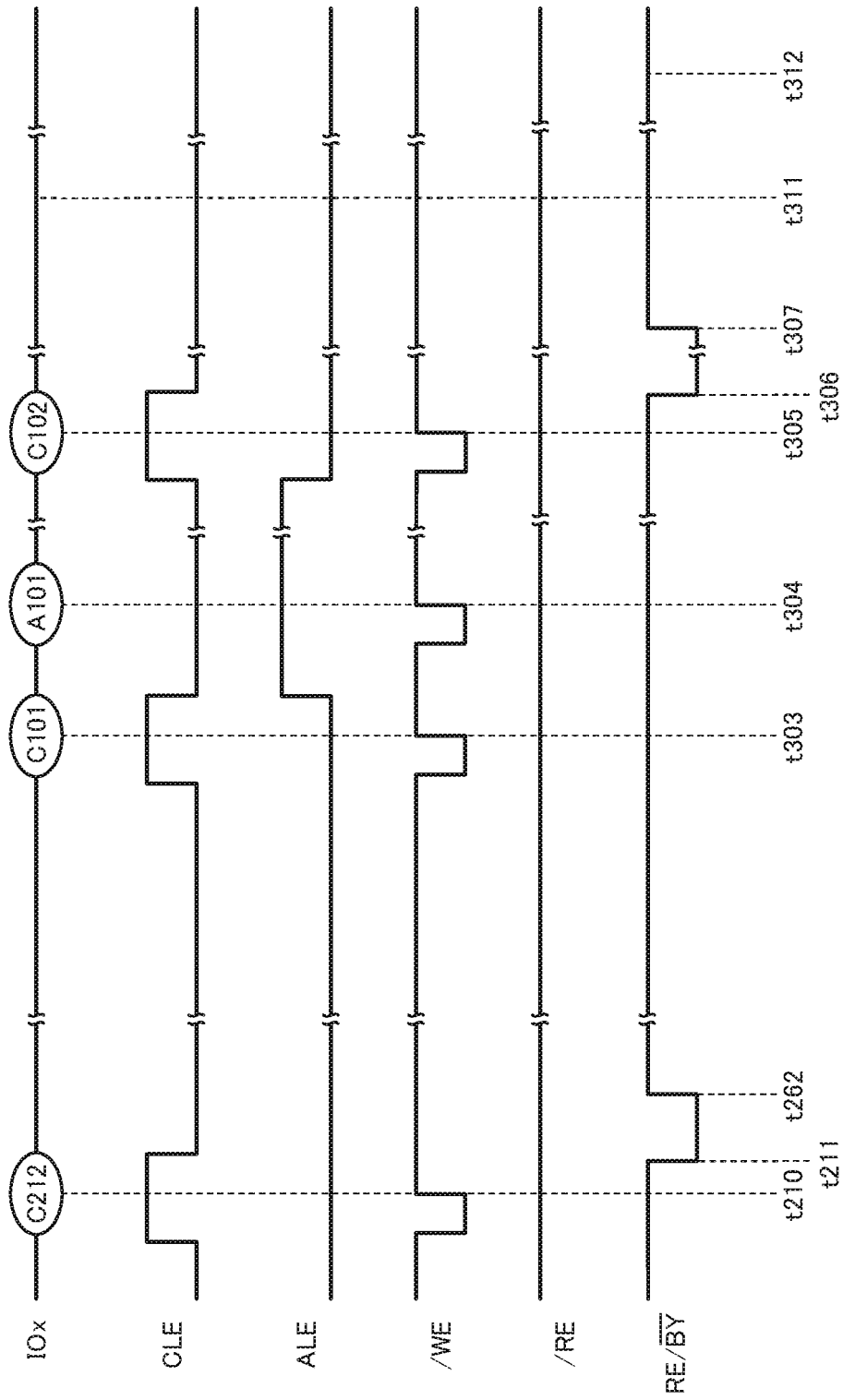
FIG. 27 is a timing chart to describe a suspend operation according to the second embodiment.

FIG. 27 is a timing chart to describe the suspend operation.

In this embodiment, the terminal RY//BY is in the "H" state while the write operation is being performed, and the access to the memory die MD is permitted. Accordingly, when the suspend operation is performed, the command to interrupt the write operation (the data C301 in FIG. 16) is not input. That is, when the suspend operation is performed, for example, as exemplified in FIG. 27, the command set described with reference to FIG. 7 is input while the write operation is being performed.

Additionally, in this embodiment, when the write operation is resumed, the command to resume the write operation (the data C302 in FIG. 16) is not input. For example, as exemplified in FIG. 27, after the read operation terminates at the timing t307, the write operation is automatically resumed at the timing t311.

Figure 28:
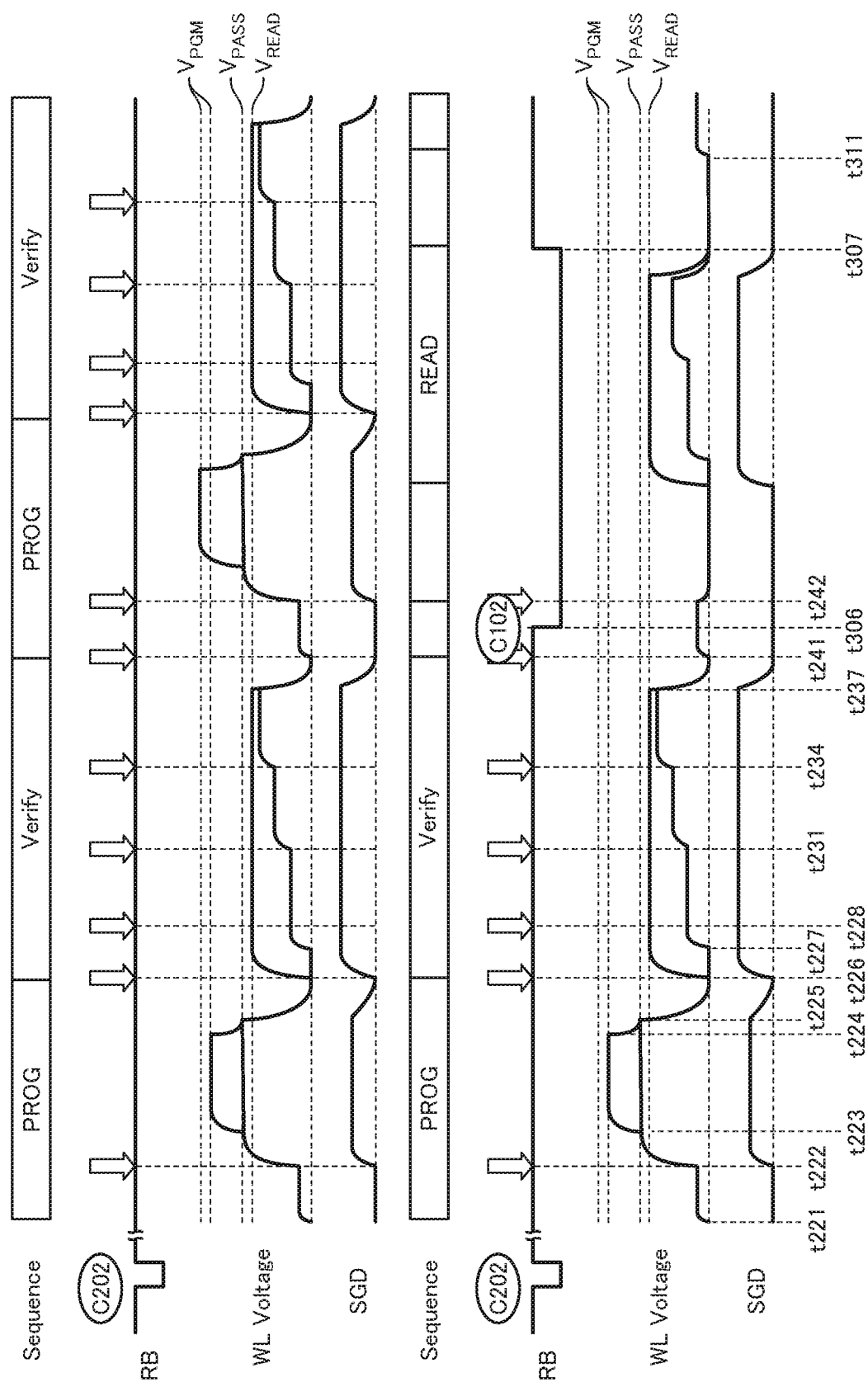
FIG. 28 is a timing chart to describe the suspend operation according to the second embodiment.

FIG. 28 is a timing chart to describe the suspend operation.

The suspend operation according to the embodiment is performed basically similarly to the suspend operation according to the first embodiment. However, as described above, in this embodiment, the command to interrupt the write operation (data C301) is not input. Therefore, not the determination whether to perform the suspend operation based on the presence/absence of the command (data C301) or not, for example, whether to perform the suspend operation or not is determined based on presence/absence of the command (data C102, C104) to start the first read operation or the second read operation. For example, the determination process of suspend operation (Steps S203, S208 in FIG. 12, Step S222 in FIG. 13, and Steps S234, S238 in FIG. 14), for example, refers to the command register CMR by the sequencer SQC (FIG. 4) to confirm the presence/absence of the command to start the first read operation or the second read operation (data C102, C104), not the command to interrupt the write operation (data C301).

Other Embodiments

The semiconductor memory devices according to the first embodiment and the second embodiment have been described above. However, the semiconductor memory devices according to these embodiments are merely examples, and specific configurations, operations, and the like are appropriately adjustable.

For example, the command sets input from the control die CD to the memory die MD in the write operation, the read operation, the verify operation, and the like are appropriately adjustable. For example, in the above-described example, the command sets input to the memory die MD in the read operation and the write operation include the five pieces of data corresponding to the address data ADD. However, the number of pieces of data input as the address data ADD may be six or may be other values.

Additionally, for example, the processes in the respective steps in the write operation are appropriately adjustable.

For example, in the example of FIG. 12 to FIG. 14, the suspend operation can be performed during the write operation as many times as desired. However, for example, at Steps S203 and S208 in FIG. 12, Step S222 in FIG. 13, and Steps S234 and S238 in FIG. 14, the upper limit count of the suspend operation may be set. The count of the suspend operation in these steps may be reset in association with update of the write loop (Step S207 in FIG. 12). For example, the upper limit count of the suspend operation may be set to each write loop. For example, when the upper limit count of the suspend operation in each write loop is one time and the suspend operation is performed at Step S222 in FIG. 13, the suspend operation is not performed until the write loop is updated (Step S207 in FIG. 12).

Figure 29:
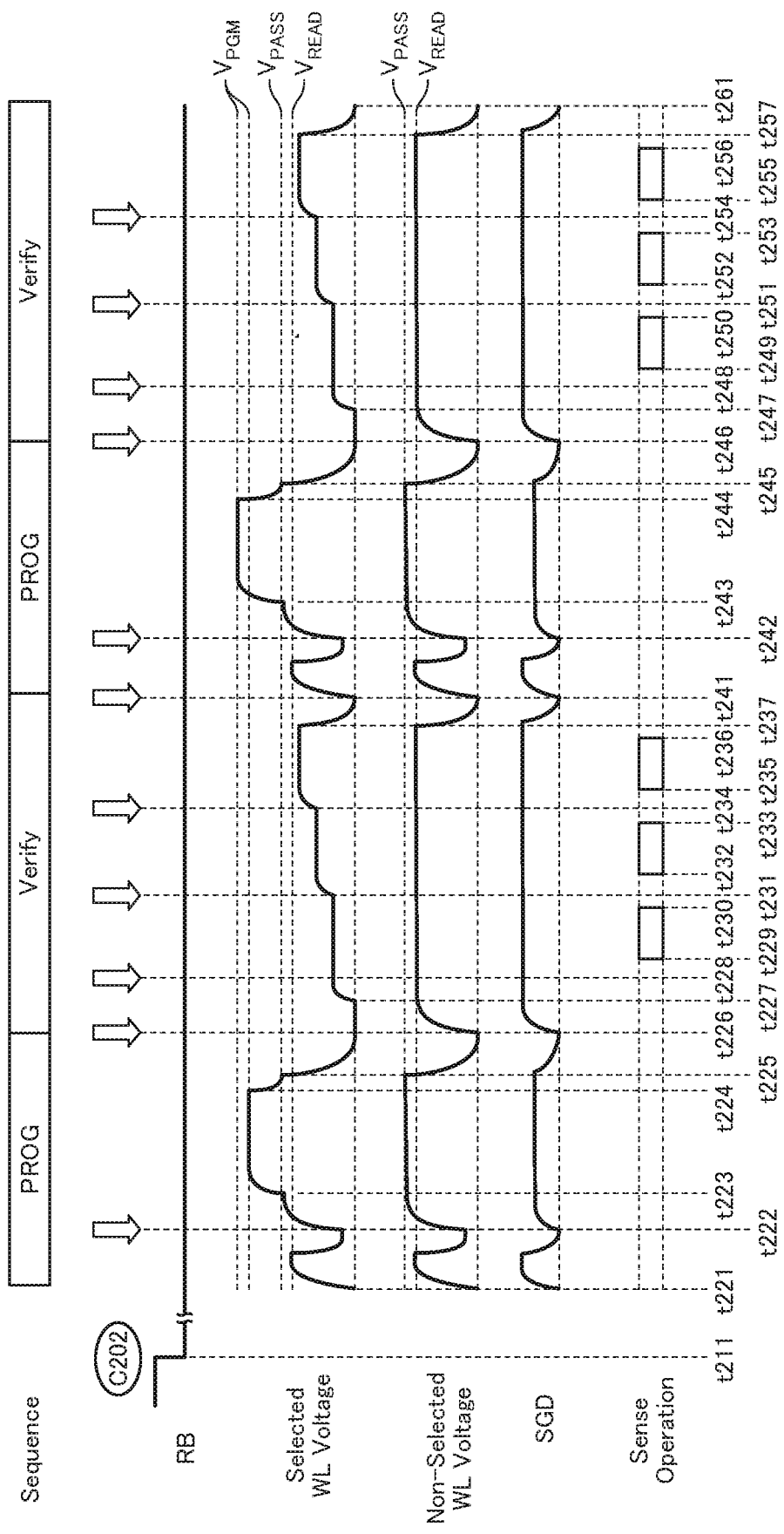
FIG. 29 is a timing chart to describe a write operation according to another embodiment.

For example, at Step S221 in FIG. 13, a constant voltage may be supplied to the word line WL and the select gate line (SGD, SGS). In such a case, for example, as exemplified in FIG. 15, FIG. 28, and the like, the constant voltage is supplied to the word line WL and the select gate line (SGD, SGS) in the period from the timing t221 to the timing t222 and the period corresponding to this. At Step S221 in FIG. 13, a plurality of voltages may be sequentially supplied to the word line WL and the select gate lines (SGD, SGS). For example, in the example illustrated in FIG. 29, the read pass voltage $V_{READ}$ is supplied to the word line WL for a certain period from the timing t221 and the voltage $V_{SG}$ is supplied to the select gate line (SGD, SGS). In the period from the termination of the supply of these voltages until the timing t222, the voltage around the ground voltage $V_{SS}$ is supplied to the word line WL and the select gate line (SGD, SGS).

For example, in the processes from Step S223 to Step S225 in FIG. 13, the write pass voltage $V_{PASS}$ is supplied to the word line WL once at Step S223. However, this aspect is appropriately changeable. For example, a step to increase the write pass voltage $V_{PASS}$ may be disposed between Step S224 and Step S225.

For example, in the processes from Step S232 to Step S238 in FIG. 14, the read pass voltage $V_{READ}$ is supplied to the word line WL once at Step S232. However, this aspect is appropriately changeable. For example, a step to increase the read pass voltage $V_{READ}$ may be disposed at a timing between Step S237 and Step S238 or another timing.

Figure 30:
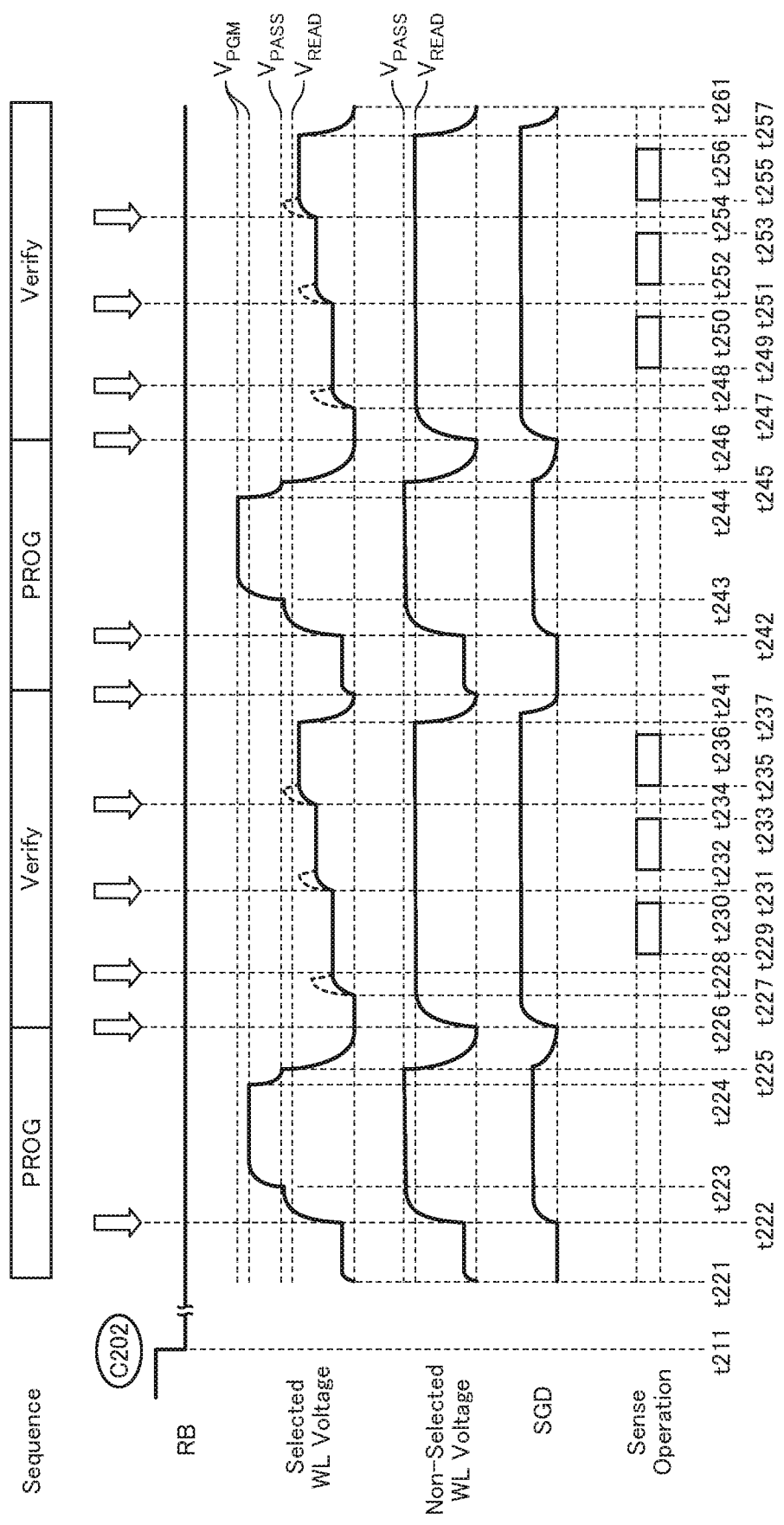
FIG. 30 is a timing chart to describe a write operation according to another embodiment.

For example, at Step S233 in FIG. 14, the verify voltage $V_{VFY}$ may be directly supplied to the selected word line WL. In such a case, for example, as exemplified in FIG. 15, FIG. 28, and the like, the constant verify voltage $V_{VFY}$ is supplied to the selected word line WL at the timings t227, t231, t234 or the timings corresponding to the timings. At Step S233 in FIG. 14, to charge the selected word line WL at high speed, a voltage larger than the targeted verify voltage $V_{VFY}$ may be supplied to the selected word line WL for a certain period immediately after the start of charging. For example, in the example illustrated in FIG. 30, the voltage larger than the verify voltage $V_{VFY}$ is supplied to the selected word line WL for a certain period from the timings t227, t231, t234 or the timing corresponding to the timing. Additionally, at the timing after an elapse of the certain period, the verify voltage $V_{VFY}$ is supplied to the selected word line WL.

Note that, as described above, at Step S237 in FIG. 14, the verify voltage $V_{VFY}$ may be increased or may be reduced. When the verify voltage is reduced, for example, to discharge the electric charge of the selected word line WL at high speed, a voltage smaller than the target verify voltage $V_{VFY}$ may be supplied to the selected word line WL for a certain period immediately after the start of discharge at Step S233 in FIG. 14.

Additionally, the processes in the respective steps of the first read operation are appropriately adjustable. For example, various kinds of processes that can be performed in the verify operation also can be performed in the first read operation.

For example, FIGS. 2 and 3 have illustrated the example in which the plurality of memory dies MD and the control die CD are laminated on the mounting substrate MSB and the pad electrodes P of the mounting substrate MSB, the plurality of memory dies MD, and the control die CD are connected via the bonding wires B. However, for example, the plurality laminated memory dies MD may be configured as a first package and the control die CD may be configured as a second package. Further, the pad electrodes P of the mounting substrate MSB and the plurality of memory dies MD may be connected with, for example, other electrodes or wirings, not the bonding wires B. For example, they may be connected with electrodes passing through the substrate of the memory die MD or the like, so-called Through Silicon Via (TSV) electrodes, and the like.

For example, FIG. 4 has illustrated the external control terminals /CEn, CLE, ALE, /WE, /RE. Here, the signs "/" of these external control terminals indicate that the input signal is an inverted signal. The external control terminal to which the inverted signal is input may be configured such that the non-inverted signal is input, or the external control terminal to which the non-inverted signal is input may be configured such that the inverted signal is input. In this case, at least one of the external control terminals may be replaced by CEn, /CLE, /ALE, WE, RE. For example, when WE is used as the external control terminal, data may be input at a timing at which this external control terminal WE falls from "H" to "L." Similarly, when RE is used as the external control terminal, data may be switched at a timing at which this external control terminal RE falls from "H" to "L."

Figure 31:
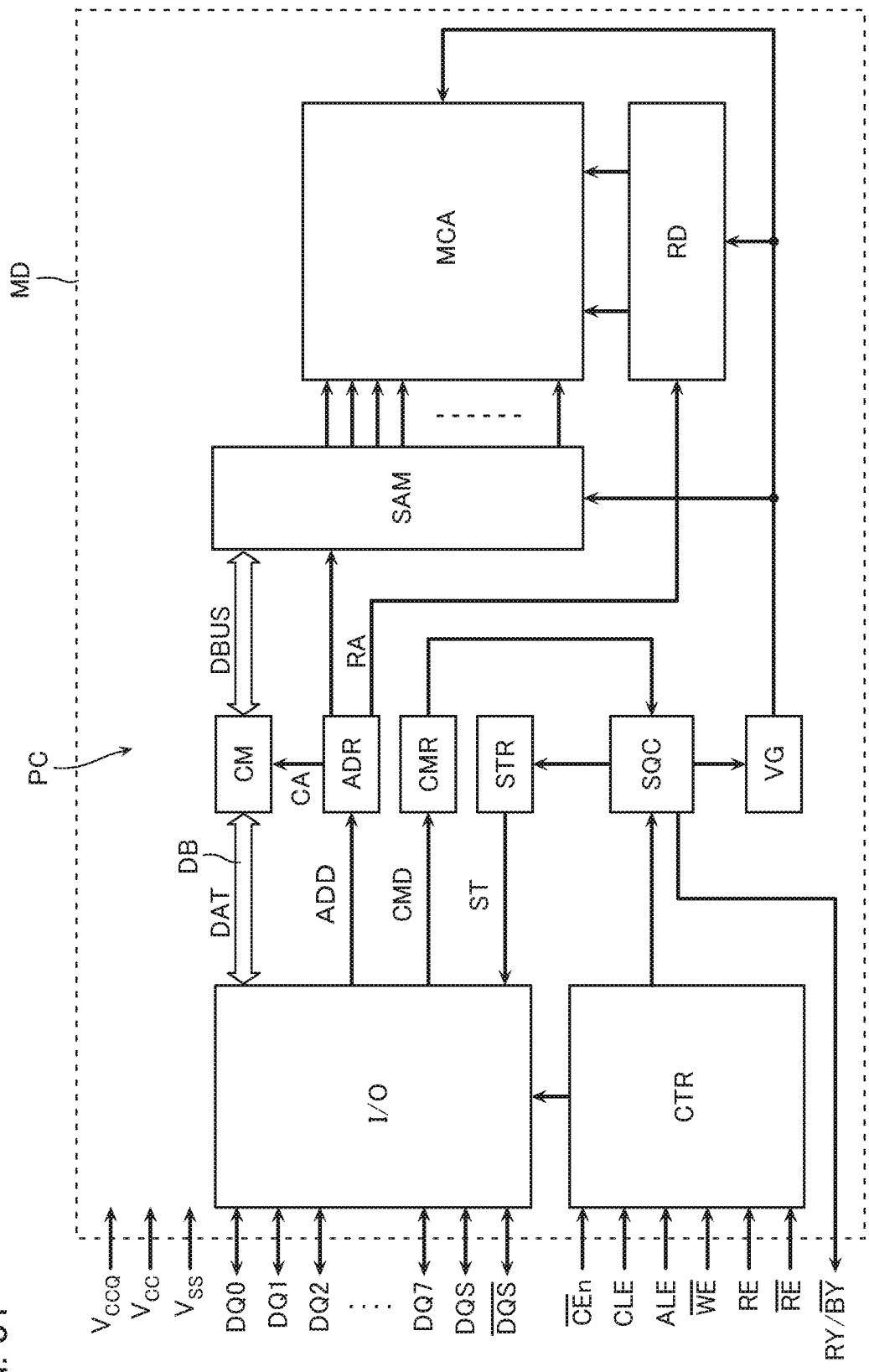
FIG. 31 is a schematic block diagram illustrating a configuration of the memory die MD according to another embodiment.

For example, FIG. 4 have illustrated the example in which the power supply voltage $V_{CC}$ and ground voltage $V_{SS}$ are supplied to the terminals of the memory die MD. However, such a configuration is merely an example, and the specific configuration is appropriately adjustable. For example, in example of FIG. 31, a power supply voltage $V_{CCQ}$ is supplied to the terminals of the memory die MD, in addition to the power supply voltage $V_{CC}$ and the ground voltage $V_{SS}$. These terminals are achieved by, for example, the pad electrodes P described with reference to FIG. 2 and FIG. 3. The power supply voltage $V_{CCQ}$ is smaller than the power supply voltage $V_{CC}$ and is usable to drive the configuration in the input/output control circuit I/O.

For example, FIG. 4 has illustrated the example in which the input/output control circuit I/O includes the data input/output terminals I/O0 to I/O7. However, such a configuration is merely an example, and the specific configuration is appropriately adjustable. For example, in the example of FIG. 31, instead of the data input/output terminals I/O0 to I/O7, the input/output control circuit I/O includes data signal input/output terminals DQ0 to DQ7 and clock signal input/output terminals DQS, /DQS. The data signal input/output terminals DQ0 to DQ7 and the clock signal input/output terminals DQS, /DQS are achieved by, for example, the pad electrodes P described with reference to FIG. 2 and FIG. 3. The data signal input/output terminals DQ0 to DQ7 are, for example, used similarly to the data input/output terminals I/O0 to I/O7. The clock signal input/output terminals DQS, /DQS are used in the data input via the data signal input/output terminals DQ0 to DQ7. The data input via the data signal input/output terminals DQ0 to DQ7 are retrieved in the shift register in the input/output control circuit I/O at a timing of a voltage rise of the clock signal input/output terminal DQS and a voltage fall of the clock signal input/output terminal /DQS and a timing of a voltage fall of the clock signal input/output terminal DQS and a voltage rise of the clock signal input/output terminal /DQS. Note that the external control terminal /WE may be used or the clock signal input/output terminals DQS, /DQS may be used for data input.

For example, FIG. 4 has illustrated the example that the logic circuit CTR includes the external control terminals /CEn, CLE, ALE, /WE, /RE. However, such a configuration is merely an example, and the specific configuration is appropriately adjustable. For example, in the example of FIG. 31, the logic circuit CTR includes the external control terminal RE, in addition to the external control terminals /CEn, CLE, ALE, /WE, /RE. The external control terminal RE is achieved by, for example, the pad electrode P described with reference to FIG. 2 and FIG. 3. The external control terminal RE is, for example, used together with the external control terminal /RE in data output via the data signal input/output terminals DQ0 to DQ7. The data output from the data signal input/output terminals DQ0 to DQ7 are switched at a timing of a voltage fall of the external control terminal RE and a voltage rise of the external control terminal /RE and a timing of a voltage rise of the external control terminal RE and a voltage fall of the external control terminal /RE.

For example, FIG. 6 has illustrated the drawing of the example in which the four latch circuits ADL, BDL, CDL, DDL are connected to the wiring lbus. However, the number of latch circuits connected to the wiring lbus is appropriately adjustable.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first memory string that includes a first memory cell and a second memory cell;
a first wiring electrically connected to the first memory cell;
a second wiring electrically connected to the second memory cell;
a voltage supply circuit configured to supply a program voltage and a write pass voltage to the first wiring and the second wiring, respectively, the program voltage being higher than the write pass voltage; and
a control circuit configured to control the voltage supply circuit, wherein the control circuit is configured:
to perform a program operation in a write operation to the first memory cell;
to supply the program voltage to the first wiring and supply the write pass voltage to the second wiring in the program operation;
to start the program operation at a first timing of the write operation;
to start supplying the write pass voltage to the second wiring at a second timing after the first timing, the write pass voltage corresponding to the program operation; and
such that when a first command is received in a first period between the first timing and the second timing, the control circuit suspends the write operation before the supply of the write pass voltage corresponding to the program operation starts.

2. The semiconductor memory device according to claim 1, wherein
the control circuit is configured such that when the first command is received in the first period, the control circuit resumes the write operation from a process corresponding to the first timing.

3. The semiconductor memory device according to claim 1, wherein:
the voltage supply circuit is configured to supply a verify voltage and a read pass voltage to the first wiring and the second wiring, respectively, the verify voltage is being lower than the write pass voltage, and the read pass voltage being higher than the verify voltage and lower than the program voltage, and
the control circuit is configured to:
perform a program verify operation after performing the program operation in the write operation to the first memory cell; and
supply the verify voltage to the first wiring and supply the read pass voltage to the second wiring in the program verify operation.

4. The semiconductor memory device according to claim 3, wherein
in the write operation, the control circuit is configured:
to terminate the supply of the write pass voltage to the second wiring at a third timing after the second timing, the write pass voltage corresponding to the program operation;
to start supplying the read pass voltage to the second wiring at a fourth timing after the third timing, the read pass voltage corresponding to the program verify operation; and
such that when the first command is received in a second period between the second timing and the fourth timing without receiving the first command in the first period, the control circuit suspends the write operation after the third timing and before the supply of the read pass voltage corresponding to the program verify operation starts.

5. The semiconductor memory device according to claim 4, wherein
the control circuit is configured such that when the first command is received in the second period, the control circuit resumes the write operation from a process corresponding to the fourth timing.

6. The semiconductor memory device according to claim 4, wherein
in the write operation, the control circuit is configured:
to start supplying a first verify voltage to the first wiring at a fifth timing after the fourth timing, the first verify voltage corresponding to the program verify operation;
to cause a voltage of the first wiring to be the first verify voltage at a sixth timing after the fifth timing;
to start supplying a second verify voltage to the first wiring at a seventh timing after the sixth timing;
such that when the first command is received in a third period between the fourth timing and the sixth timing, the control circuit suspends the write operation at the sixth timing; and
such that when the first command is received in a fourth period between the sixth timing and the seventh timing, the control circuit suspends the write operation before the supply of the second verify voltage starts.

7. The semiconductor memory device according to claim 6, wherein
the control circuit is configured:
such that when the first command is received in the third period, the control circuit resumes the write operation from a process corresponding to the fourth timing; and
such that when the first command is received in the fourth period, the control circuit performs the process corresponding to the fourth timing of the write operation, omits processes corresponding to the fifth timing and the sixth timing, and performs processes corresponding to the seventh timing and after the seventh timing of the write operation.

8. The semiconductor memory device according to claim 6, wherein
the control circuit is configured such that when the first command is not received from the first timing until the seventh timing, the control circuit:
starts the program operation at the first timing;
starts supplying the write pass voltage to the second wiring at the second timing, the write pass voltage corresponding to the program operation;
terminates supplying the write pass voltage to the second wiring at the third timing, the write pass voltage corresponding to the program operation;
starts supplying the read pass voltage to the second wiring at the fourth timing, the read pass voltage corresponding to the program verify operation;
starts supplying the first verify voltage to the first wiring at the fifth timing;
causes a voltage of the first wiring to be the first verify voltage at the sixth timing; and
starts supplying the second verify voltage to the first wiring at the seventh timing.

9. The semiconductor memory device according to claim 1, comprising:
a second memory string that includes a third memory cell; and
a third wiring electrically connected to the third memory cell, wherein:
the voltage supply circuit is configured to supply a read voltage lower than the write pass voltage to the third wiring, and
the control circuit is configured to:
supply the read voltage to the third wiring in a read operation to the third memory cell; and
perform the read operation to the third memory cell after the write operation is suspended and before the write operation is resumed.

10. A semiconductor memory device comprising:
a memory string that includes a first memory cell and a second memory cell;
a first wiring electrically connected to the first memory cell;
a second wiring electrically connected to the second memory cell;
a voltage supply circuit configured to supply a verify voltage and a read pass voltage to the first wiring and the second wiring, respectively, the read pass voltage being higher than the verify voltage; and
a control circuit configured to control the voltage supply circuit, wherein
the control circuit is configured:
to perform a program verify operation in a write operation to the first memory cell;
to supply the verify voltage to the first wiring and supply the read pass voltage to the second wiring in the program verify operation;
to start supplying the read pass voltage to the second wiring at a first timing of the write operation, the read pass voltage corresponding to the program verify operation;
to start supplying a first verify voltage to the first wiring at a second timing after the first timing, the first verify operation corresponding to the program verify operation;
to cause a voltage of the first wiring to be the first verify voltage at a third timing after the second timing;
to start supplying a second verify voltage to the first wiring at a fourth timing after the third timing;
such that when a first command is received in a first period between the first timing and the third timing, the control circuit suspends the write operation at the third timing; and
such that when the first command is received in a second period between the third timing and the fourth timing, the control circuit suspends the write operation before the supply of the second verify voltage starts.

11. The semiconductor memory device according to claim 10, wherein
the control circuit is configured such that:
when the first command is received in the first period, the control circuit resumes the write operation from a process corresponding to the first timing; and
when the first command is received in the second period, the control circuit performs a process corresponding to the first timing of the write operation, omits processes corresponding to the second timing and the third timing, and performs processes corresponding to the fourth timing and after the fourth timing of the write operation.

12. A semiconductor memory device comprising:
a first memory string that includes a first memory cell and a second memory cell;
a first wiring electrically connected to the first memory cell;
a second wiring electrically connected to the second memory cell;
a voltage supply circuit configured to supply a program voltage and a write pass voltage to the first wiring and the second wiring, respectively, the program voltage being higher than the write pass voltage;
a control circuit configured to control the voltage supply circuit;
a first terminal usable to input a command to the control circuit; and
a second terminal usable to output information indicative of a state of the control circuit, wherein
the control circuit is configured:
to perform a program operation in a write operation to the first memory cell;
to supply the program voltage to the first wiring and supply the write pass voltage to the second wiring in the program operation;
to start the write operation in response to reception of a first command via the first terminal;
to change the information to be output from the second terminal from a first state to a second state at a first timing of the write operation;
to start the program operation at a second timing after the first timing;
to start supplying the write pass voltage to the second wiring at a third timing after the second timing, the write pass voltage corresponding to the program operation; and
such that when a second command is received via the first terminal in a first period between the second timing and the third timing, the control circuit changes the information to be output from the second terminal from the second state to the first state without supplying the write pass voltage corresponding to the program operation.

13. A semiconductor memory device comprising:
a first memory string that includes a first memory cell and a second memory cell;

a first wiring electrically connected to the first memory cell;

a second wiring electrically connected to the second memory cell;

a voltage supply circuit configured to supply a read pass voltage, a write pass voltage, and a program voltage to the first wiring and the second wiring, the program voltage being higher than the read pass voltage and the write pass voltage;

a control circuit configured to control the voltage supply circuit;

a first terminal usable to input a command to the control circuit; and a second terminal usable to output information indicative of a state of the control circuit, wherein the control circuit is configured:

to perform a program operation and a program verify operation performed in a write operation to the first memory cell, the program verify operation being performed after the program operation is performed;

to supply the program voltage to the first wiring and supply the write pass voltage to the second wiring in the program operation;

to supply the read pass voltage to the second wiring in the program verify operation;

to start the write operation in response to reception of a first command via the first terminal;

to change the information to be output from the second terminal from a first state to a second state at a first timing of the write operation;

to start the program operation at a second timing after the first timing;

to start supplying the write pass voltage to the second wiring at a third timing after the second timing, the write pass voltage corresponding to the program operation;

to terminate the supply of the write pass voltage to the second wiring at a fourth timing after the third timing, the write pass voltage corresponding to the program operation;

to start supplying a read pass voltage to the second wiring at a fifth timing after the fourth timing, the read pass voltage corresponding to the program verify operation;

such that when a second command is received via the first terminal in a first period between the second timing and the third timing, the control circuit changes the information to be output from the second terminal from the second state to the first state at a sixth timing after the second timing; and such that when the second command is received via the first terminal in a second period between the third timing the fifth timing, the control circuit changes the information to be output from the second terminal from the second state to the first state at a seventh timing after the third timing, and wherein a period from the first timing until the sixth timing is shorter than a period from the first timing until the seventh timing.

\* \* \* \* \*